(12) United States Patent
Kim et al.

(10) Patent No.: US 10,381,418 B2
(45) Date of Patent: Aug. 13, 2019

(54) ORGANIC LIGHT EMITTING DIODE DISPLAY DEVICE

(71) Applicant: SAMSUNG DISPLAY CO., LTD., Yongin-si, Gyeonggi-do (KR)

(72) Inventors: Jin-Seock Kim, Seongnam-si (KR); Jong-Hee Park, Yongin-si (KR); Bong-Won Lee, Seoul (KR); Seung-Bae Kang, Suwon-si (KR); Sang-Gab Kim, Seoul (KR); Jeong-Min Park, Seoul (KR); Hyun-Eok Shin, Gwacheon-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/678,640

(22) Filed: Aug. 16, 2017

(65) Prior Publication Data

US 2018/0061895 A1    Mar. 1, 2018

(30) Foreign Application Priority Data

Aug. 30, 2016 (KR) .................. 10-2016-0110618

(51) Int. Cl.
*H01L 27/32* (2006.01)
*H01L 51/50* (2006.01)
*H01L 51/52* (2006.01)

(52) U.S. Cl.
CPC ........ *H01L 27/322* (2013.01); *H01L 27/3246* (2013.01); *H01L 27/3276* (2013.01); *H01L 51/504* (2013.01); *H01L 51/5237* (2013.01)

(58) Field of Classification Search
CPC ................. H01L 27/322; H01L 27/3246
See application file for complete search history.

(56) References Cited

U.S. PATENT DOCUMENTS

| | | | |
|---|---|---|---|
| 2016/0013436 A1* | 1/2016 | Im | H01L 51/5206 257/40 |
| 2016/0351846 A1* | 12/2016 | Kim | H01L 51/5212 |
| 2017/0141176 A1* | 5/2017 | Im | H01L 51/5228 |
| 2018/0061855 A1* | 3/2018 | Min | H01L 21/50 |

FOREIGN PATENT DOCUMENTS

| | | |
|---|---|---|
| KR | 10-2006-0065847 A | 6/2006 |
| KR | 10-0805124 B1 | 2/2008 |
| KR | 10-1385457 B1 | 4/2014 |
| KR | 10-2016-0014259 A | 2/2016 |
| KR | 10-2016-0084546 A | 7/2016 |

* cited by examiner

*Primary Examiner* — Walter H Swanson
(74) *Attorney, Agent, or Firm* — Lee & Morse, P.C.

(57) ABSTRACT

An OLED display device includes a substrate including a display region and a pad region, a display structure in the display region on the substrate, and a pad electrode structure in the pad region on the substrate, the pad electrode structure having a first pad electrode on the substrate, a first insulation layer covering opposite lateral portions of the first pad electrode and exposing a portion of an upper surface of the first pad electrode, a second pad electrode on the first pad electrode and on the first insulation layer, the second pad electrode having a step portion where the first pad electrode and the first insulation layer are overlapped, and a third pad electrode on the second pad electrode and on the first insulation layer, the third electrode covering the second pad electrode.

15 Claims, 20 Drawing Sheets

FIG. 1
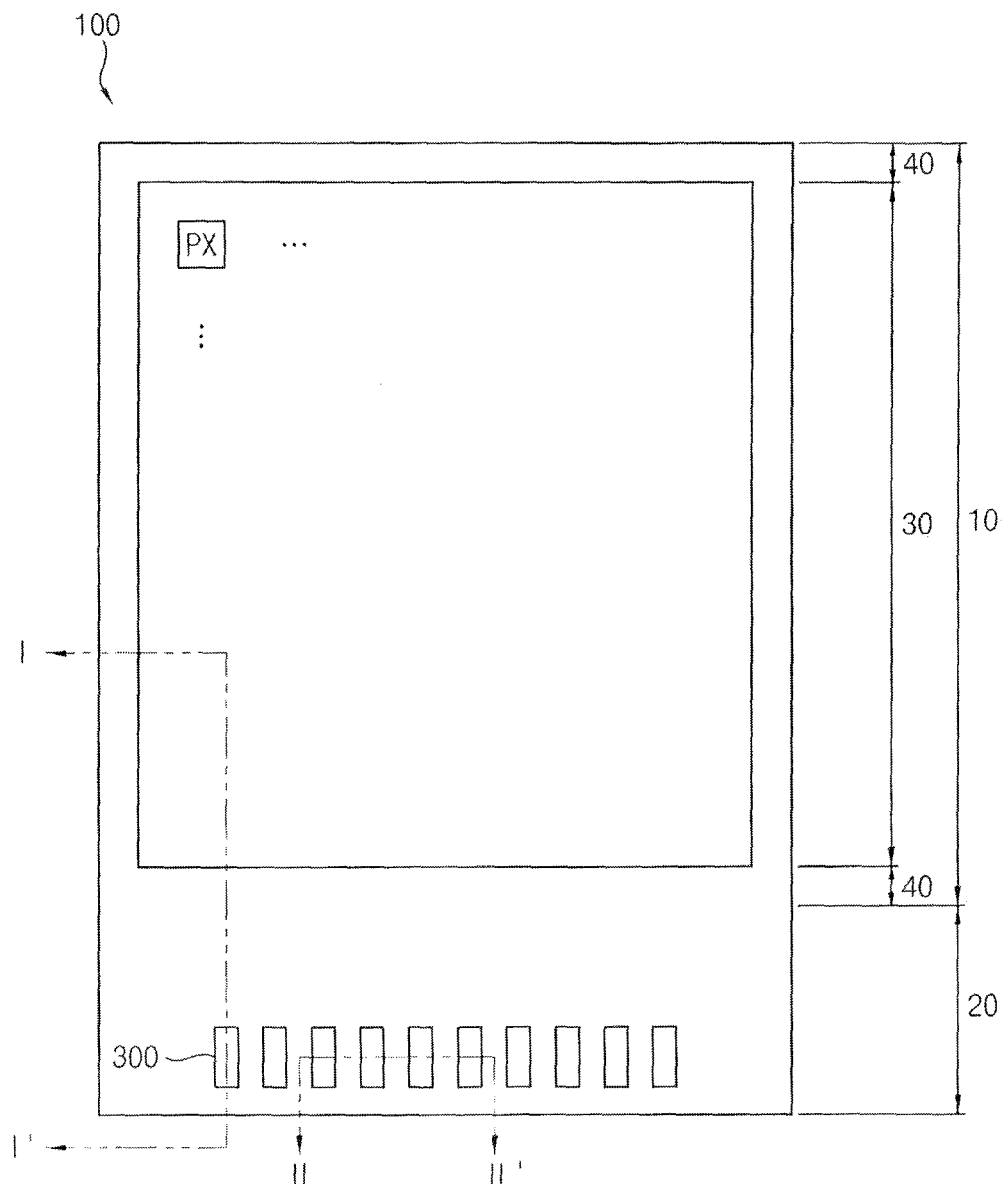
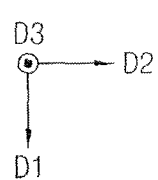

ORGANIC LIGHT EMITTING DIODE DISPLAY DEVICE

CROSS-REFERENCE TO RELATED APPLICATION

Korean Patent Application No. 10-2016-0110618, filed on Aug. 30, 2016, in the Korean Intellectual Property Office, and entitled: "Organic Light Emitting Diode Display Device," is incorporated by reference herein in its entirety.

BACKGROUND

1. Field

Example embodiments relate generally to organic light emitting diode display devices. More particularly, embodiments relate to organic light emitting diode display devices including a pad electrode structure.

2. Description of the Related Art

A flat panel display (FPD) device is widely used as a display device of an electronic device because the FPD device is lightweight and thin, e.g., compared to a cathode-ray tube (CRT) display device. Examples of the FPD device may include a liquid crystal display (LCD) device and an organic light emitting diode (OLED) display device. Compared to the LCD device, the OLED display device has many advantages, e.g., a higher luminance and a wider viewing angle. In addition, the OLED display device can be made thinner because the OLED display device does not require a backlight unit. In the OLED display device, electrons and holes are injected into an organic thin layer through a cathode and an anode, and then recombined in the organic thin layer to generate excitons, thereby a light of a certain wavelength can be emitted.

Pad electrodes may be disposed in a portion of the OLED display device, and the OLED display device and an external device may be electrically connected through the pad electrodes. In addition, the external device may provide scan signals, data signals, emission signals, power supply voltages. etc. to the OLED display device.

SUMMARY

According to some example embodiments, an organic light emitting diode (OLED) display device includes a substrate, a display structure, and a pad electrode structure. The substrate includes a display region and a pad region. The display structure is disposed in the display region on the substrate. The pad electrode structure is disposed in the pad region on the substrate, and includes a first pad electrode, a first insulation layer, a second pad electrode, and a third pad electrode. The first pad electrode is disposed on the substrate. The first insulation layer covers both lateral portions of the first pad electrode and exposes a portion of an upper surface of the first pad electrode. The second pad electrode is disposed on the first pad electrode and the first insulation layer, and has a step portion where the first pad electrode and the first insulation layer are overlapped. The third pad electrode is disposed on the second pad electrode and the first insulation layer, and covers the second pad electrode.

In example embodiments, the pad electrode structure may further include a second insulation layer covering both lateral portions of the third pad electrode.

In example embodiments, the second insulation layer may be disposed on a portion of the third pad electrode and the first insulation layer such that a distal end portion of the third pad electrode is not exposed.

In example embodiments, a height from the substrate to an upper surface of the second insulation layer may be less than a height from the substrate to an upper surface of the third pad electrode that is located in the step portion.

In example embodiments, the display structure may include a lower electrode disposed in the display region on the substrate, a light emitting layer disposed on the lower electrode, and an upper electrode disposed on the light emitting layer.

In example embodiments, the lower electrode and the third pad electrode may be simultaneously formed using the same material.

In example embodiments, the OLED display device may further include a planarization layer and a pixel defining layer. The planarization layer may be disposed between the substrate and the display structure. The pixel defining layer may be disposed on the planarization layer, and may cover both lateral portions of the lower electrode.

In example embodiments, the pixel defining layer and the second insulation layer may be simultaneously formed using the same material.

In example embodiments, a distal end portion of the third pad electrode may be in contact with an upper surface of the first insulation layer such that the second pad electrode is not exposed.

In example embodiments, each of the second pad electrode and the third pad electrode may have a stack electrode structure including a plurality of electrode layers.

In example embodiments, the second pad electrode may have the stack electrode structure including titanium/aluminum/titanium, and the third pad electrode may have the stack electrode structure including indium tin oxide/silver/indium tin oxide.

In example embodiments, the OLED display device may further include a semiconductor element disposed between the substrate and the display structure. The semiconductor element may include an active layer, a gate insulation layer, a gate electrode, an insulating interlayer, and source and drain electrodes. The active layer may be disposed in the display region on the substrate. The gate insulation layer may cover the active layer in the display region on the substrate, and may extend into the pad region. The gate electrode may be disposed on the gate electrode. The insulating interlayer may cover the gate electrode in the display region on the gate insulation layer, and may extend into the pad region. The source and drain electrodes may be disposed on the insulating interlayer.

In example embodiments, the gate electrode and the first pad electrode may be simultaneously formed using the same material, and the source and drain electrodes and the second pad electrode may be simultaneously formed using the same material.

In example embodiments, the gate insulation layer may be defined as the first insulation layer in the pad region, and the insulating interlayer may be defined as the second insulation layer in the pad region.

In example embodiments, the OLED display device may further include an encapsulation substrate. The encapsulation substrate may be disposed in the display region on the substrate, and may be opposite to the substrate. The substrate and the encapsulation substrate may have rigid materials.

In example embodiments, the pad electrode structure may further include a fourth pad electrode disposed between the first pad electrode and the second pad electrode.

According to some example embodiments, an OLED display device includes a substrate, a display structure, and a pad electrode structure. The substrate includes a display region and a pad region. The display structure is disposed in the display region on the substrate. The pad electrode structure is disposed in the pad region on the substrate, and includes a first pad electrode, a first insulation layer, a second pad electrode, and a second insulation layer. The first pad electrode is disposed on the substrate. The first insulation layer covers both lateral portions of the first pad electrode and exposes a portion of an upper surface of the first pad electrode. The second pad electrode is disposed on the first pad electrode and the first insulation layer, and has a step portion where the first pad electrode and the first insulation layer are overlapped. The second insulation layer covers both lateral portions of the second pad electrode, and is disposed on a portion of the second pad electrode and the first insulation layer such that a distal end portion of the second pad electrode is not exposed.

In example embodiments, a height from the substrate to an upper surface of the second insulation layer may be less than a height from the substrate to an upper surface of the second pad electrode where the step portion is located.

In example embodiments, the OLED display device may further include a semiconductor element disposed between the substrate and the display structure. The semiconductor element may include an active layer, a gate insulation layer, a gate electrode, an insulating interlayer, and source and drain electrodes. The active layer may be disposed in the display region on the substrate. The gate insulation layer may cover the active layer in the display region on the substrate, and may extend into the pad region. The gate insulation layer may be disposed in a portion of the pad region on the substrate such that the step portion is formed. The gate electrode may be disposed on the gate insulation layer. The insulating interlayer may cover the gate electrode in the display region on the gate insulation layer, and may extend into the pad region. The source and drain electrodes may be disposed on the insulating interlayer. The gate electrode and the first pad electrode may be simultaneously formed using the same material, and the source and drain electrodes and the second pad electrode may be simultaneously formed using the same material. The gate insulation layer may be defined as the first insulation layer in the pad region.

In example embodiments, the OLED display device may further include a planarization layer disposed on the insulating interlayer and covering the source and drain electrodes. The planarization layer and the second insulation layer may be simultaneously formed using the same material.

BRIEF DESCRIPTION OF THE DRAWINGS

Features will become apparent to those of ordinary skill in the art by describing in detail exemplary embodiments with reference to the attached drawings, in which:

FIG. 1 illustrates a plan view of an organic light emitting diode (OLED) display device in accordance with example embodiments;

DETAILED DESCRIPTION

Figure 2:
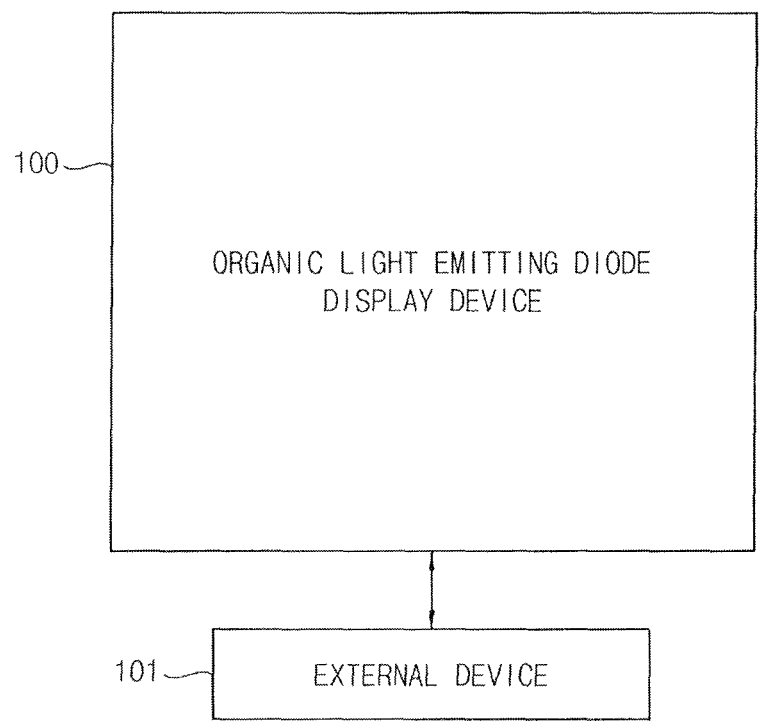
FIG. 2 illustrates a block diagram of an external device electrically connected to the OLED display device of FIG. 1.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Hereinafter, embodiments will be explained in detail with reference to the accompanying drawings.

FIG. 1 is a plan view illustrating an organic light emitting diode (OLED) display device in accordance with example embodiments. FIG. 2 is a block diagram of an external device electrically connected to the OLED display device of FIG. 1.

Referring to FIG. 1, an organic light emitting diode (OLED) display device 100 may include a display region 10 and a pad region 20. A plurality of pixels PX may be disposed in the display region 10, and the pad region 20 may be located in a side portion of the display region 10. A pad electrode structure 300 that is electrically connected to an external device may be disposed in the pad region 20.

The display region 10 may include a light emitting region 30 where a light is emitted, e.g., where an image is displayed, and a peripheral region 40 that surrounds the light emitting region 30. In example embodiments, the pixels PX, which emit light, (e.g., a display structure) may be disposed in the light emitting region 30, and a plurality of wirings may be disposed in the peripheral region 40. The pixels PX may display a displaying image, and the pad electrode structure 300 and the pixels PX may be electrically connected through the wirings in the peripheral region 40. For example, the wirings may include data signal wirings, scan signal wirings, light emission signal wirings, power supply voltage wirings, etc. In addition, scan drivers, data driver, etc. may be disposed in the peripheral region 40.

In example embodiments, a width of the peripheral region 40 surrounding the, e.g., entire, light emitting region 30 of FIG. 1 is the same, e.g., constant, but is not limited thereto. For example, the peripheral region 40 may include a first region extending in a first direction D1 and a second region extending in a second direction D2. In other words, the first region of the peripheral region 40 may be located adjacent to both lateral portions of the light emitting region 30, and the second region of the peripheral region 40 may be located adjacent to the top of the light emitting region 30 and the pad region 20. Here, a width extending in the second direction D2 of the first region may be relatively less than a width extending in the first direction D1 of the first region. For example, the first direction D1 may be parallel to an upper surface of the OLED display device 100, and the second direction D2 may be perpendicular to the first direction D1.

Referring to FIG. 2, the pixels PX that are disposed in the light emitting region 30 (FIG. 1) may be electrically connected to an external device 101 that is electrically connected to the pad electrode structure 300 through the pad electrode structure 300 and through the wirings in the peripheral region 40. For example, the external device 101 and the OLED display device 100 may be electrically connected through a flexible printed circuit board (FPCB). The external device 101 may provide data signals, scan signals, light emission signals, power supply voltages, etc. to the OLED display device 100. In addition, a driving integrated circuit may be mounted (e.g., installed) in the FPCB. In some example embodiments, the driving integrated circuit may be mounted in the pad region 20 adjacent to the pad electrode structure 300.

In example embodiments, as illustrated in FIG. 1, the OLED display device 100 may include ten pad electrode structures 300 in the pad region 20. However, embodiments are not limited thereto, e.g., the OLED display device 100 may include a plurality, e.g., any convenient number, of pad electrode structures.

Figure 3:
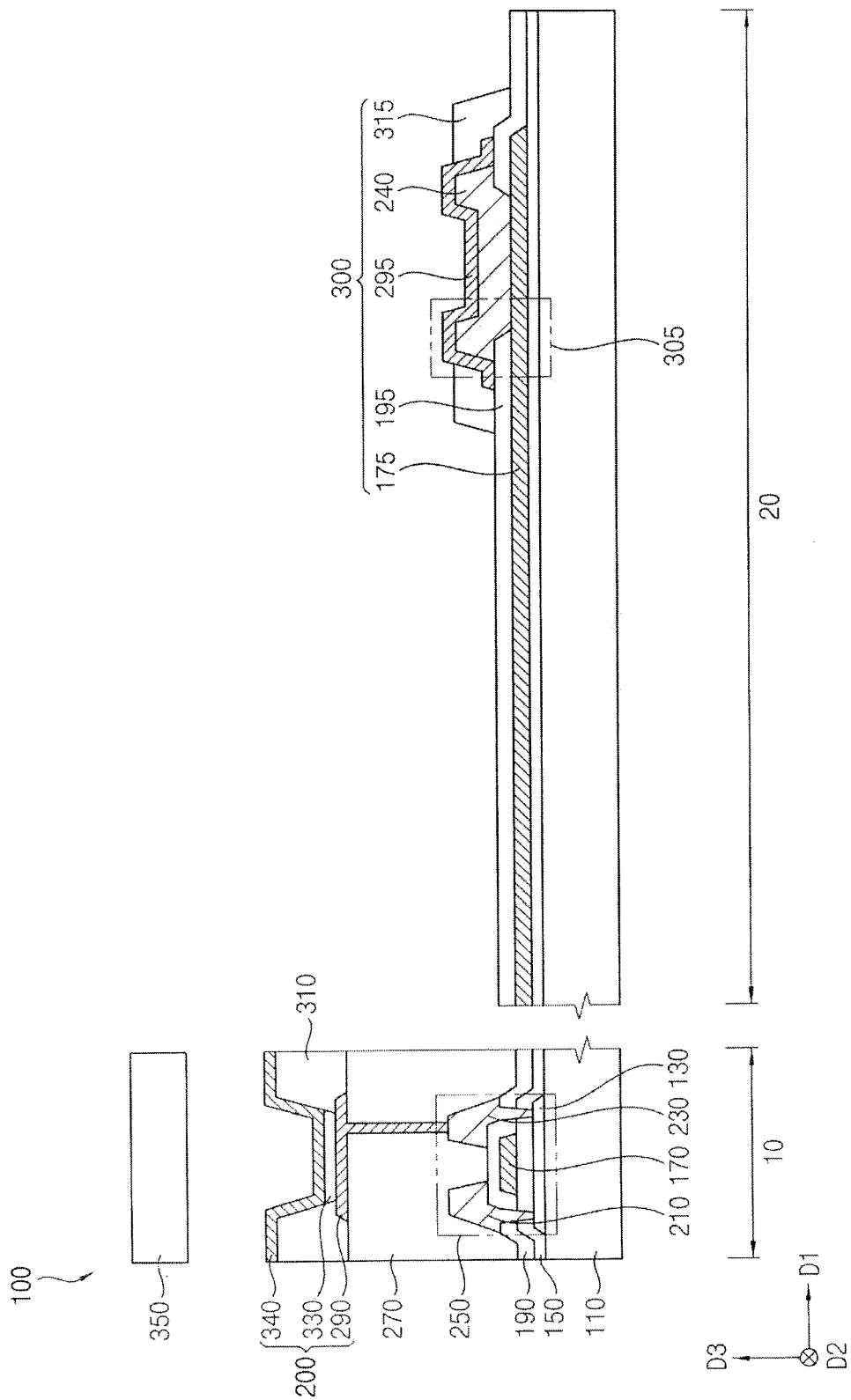
FIG. 3 illustrates a cross-sectional view taken along line I-I' of FIG. 1.
Figure 4:
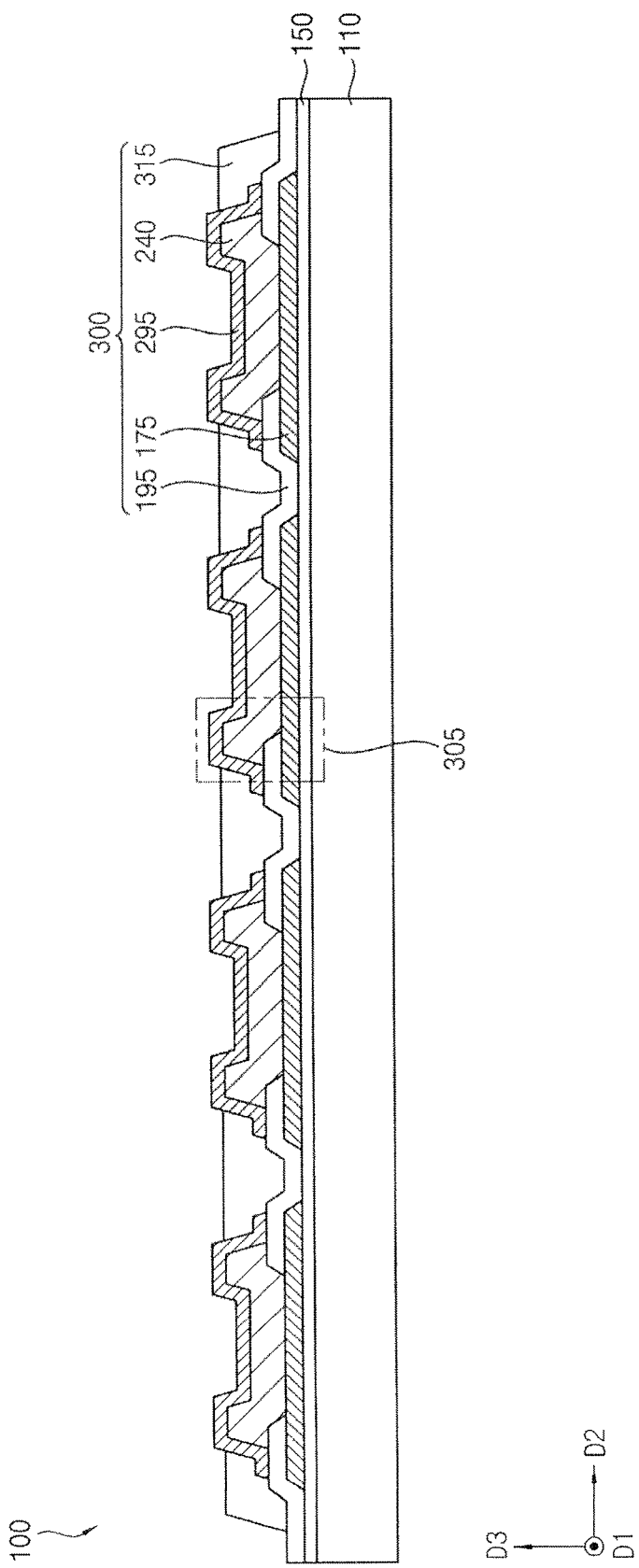
FIG. 4 illustrates a cross-sectional view taken along line II-II' of FIG. 1.
Figure 5:
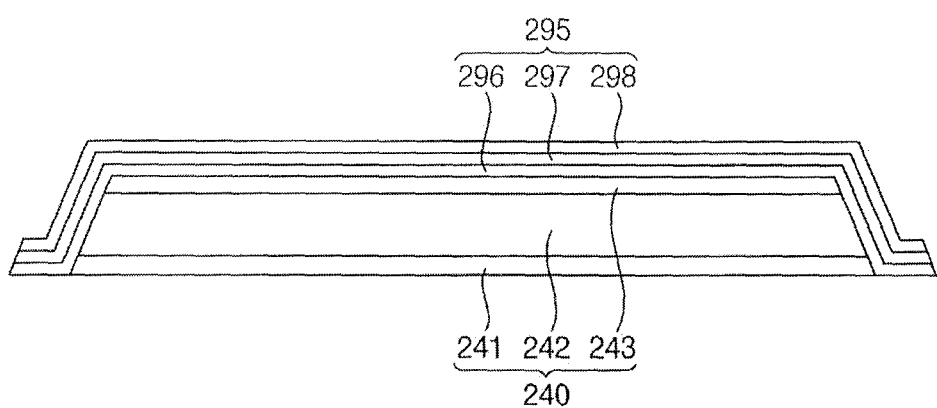
FIG. 5 illustrates a cross-sectional view of a second pad electrode and a third pad electrode included in the OLED display device of FIG. 1.

FIG. 3 is a cross-sectional view along line I-I' of FIG. 1, and FIG. 4 is a cross-sectional view taken line II-II' of FIG. 1. FIG. 5 is a cross-sectional view of a second pad electrode and a third pad electrode included in the OLED display device 100.

Referring to FIGS. 3-5, the OLED display device 100 may include a substrate 110, a semiconductor element 250, a pad electrode structure 300, a planarization layer 270, a display structure 200, a pixel defining layer 310, an encapsulation substrate 350, etc. For example, the semiconductor element 250 may include an active layer 130, a gate insulation layer 150, a gate electrode 170, an insulating interlayer 190, a source electrode 210, and a drain electrode 230. For example, the display structure 200 may include a lower electrode 290, a light emitting layer 330, and an upper electrode 340.

As illustrated in FIG. 3, the pad electrode structure 300 may include a first pad electrode 175, a first insulation layer 195, a second pad electrode 240, a third pad electrode 295, and a second insulation layer 315. The pad electrode structure 300 may be in the pad region 20 on the substrate 110, e.g., the pad electrode structure 300 may be separated from the substrate 110 by the gate insulation layer 150.

As described above, the OLED display device 100 may have the display region 10, i.e., where the pixels PX are disposed, and the pad region 20, i.e., where the pad electrode structure 300 is disposed. The pad region 20 may be peripheral to the display region 10.

The substrate 110 may be provided. The semiconductor element 250 and the display structure 200, etc. may be disposed in the display region 10 on the substrate 110, and the pad electrode structure 300 may be disposed in the pad region 20 on the substrate 110.

The substrate 110 may include transparent or opaque materials. For example, the substrate 110 may include a quartz substrate, a synthetic quartz substrate, a calcium fluoride substrate, a fluoride-doped quartz substrate, a sodalime glass substrate, a non-alkali glass substrate etc. Alternatively, the substrate 110 may include a flexible transparent material such as a flexible transparent resin substrate (e.g., a polyimide substrate). For example, the polyimide substrate may include a first polyimide layer, a barrier film layer, a second polyimide layer, etc. Since the polyimide substrate is relatively thin and flexible, the polyimide substrate may be disposed on a rigid glass substrate to help support the formation of an upper structure (e.g., the semiconductor element 250, the display structure 200, etc.). That is, the substrate 110 may have a structure in which the first polyimide layer, the barrier film layer and the second polyimide layer are stacked on the rigid glass substrate.

For example, in a manufacturing of the OLED display device 100, after an insulating layer (e.g., a buffer layer) is provided on the second polyimide layer of the polyimide substrate, the upper structure may be disposed on the buffer layer. After the upper structure is formed on the buffer layer, the rigid glass substrate on which the polyimide substrate is disposed may be removed. It may be difficult to directly form the upper structure on the polyimide substrate because the polyimide substrate is relatively thin and flexible. Accordingly, the upper structure is formed on the polyimide substrate and the rigid glass substrate, and then the polyimide substrate may serve as the substrate 110 of the OLED display device 100 after the removal of the rigid glass substrate. Since the OLED display device 100 includes the display region 10 and the pad region 20, the substrate 110 may also include the display region 10 and the pad region 20.

A buffer layer may be disposed on the substrate 110. The buffer layer may be disposed on the entire substrate 110. The buffer layer may prevent the diffusion of metal atoms and/or impurities from the substrate 110 into the semiconductor element 250. Additionally, the buffer layer may control a rate of a heat transfer in a crystallization process for forming the active layer 130, thereby obtaining a substantially uniform active layer 130. Furthermore, the buffer layer may improve a surface flatness of the substrate 110 when a surface of the substrate 110 is relatively irregular. According to a type of the substrate 110, at least two buffer layers may be provided on the substrate 110, or the buffer layer may not be disposed. For example, the buffer layer may include organic materials or inorganic materials.

The active layer 130 may be disposed on the substrate 110. For example, the active layer 130 may be disposed in the display region 10 on the substrate 110, and may include an oxide semiconductor, an inorganic semiconductor (e.g., amorphous silicon, polysilicon, etc.), an organic semiconductor, etc.

The gate insulation layer 150 may be disposed on the active layer 130. The gate insulation layer 150 may cover the active layer 130 in the display region 10, and may extend along the first direction D1 on the substrate 110. Here, the first direction D1 may be parallel to an upper surface of the substrate 110. That is, the gate insulation layer 150 may be entirely disposed in the display region 10 and the pad region 20 on the substrate 110, e.g., the gate insulation layer 150 may continuously cover the display region 10 and the pad region 20. The gate insulation layer 150 may cover the active layer 130 on the substrate 110, and may be disposed at a substantially uniform thickness along a profile of the active layer 130. Alternatively, the gate insulation layer 150 may sufficiently cover the active layer 130 on the substrate 110, and may have a substantially level surface without a step around the active layer 130. The gate insulation layer 150 may include organic materials or inorganic materials. In example embodiments, the gate insulation layer 150 may include inorganic materials, e.g., silicon compound, metal oxide, etc. In some example embodiments, the gate insulation layer 150 may be disposed only in the display region 10, and may expose the pad region 20.

The gate electrode 170 may be disposed on a portion of the gate insulation layer 150 under which the active layer 130 is located. The gate electrode 170 may include, e.g., a metal, a metal alloy, metal nitride, conductive metal oxide, transparent conductive materials, etc. These may be used alone or in a suitable combination thereof.

The first pad electrode 175 may be disposed in the pad region 20 on the substrate 110, e.g., on the gate insulation layer 150. The first pad electrode 175 may be electrically connected to a wiring disposed in the peripheral region 40 (refer to FIG. 1), and may, e.g., continuously, extend along the first direction D1 from the peripheral region 40 into the pad region 20. That is, the external device 101 (refer to FIG. 2) may provide data signals, scan signals, light emission signals, power supply voltages, etc. to the wirings disposed in the peripheral region 40 through the first pad electrode 175 in the pad region 20. For example, as illustrated in FIG. 4, when a plurality pad electrode structures 300 are formed on the substrate 110, a plurality of corresponding first pad electrodes 175 may be formed along the first direction D1, with the plurality of first pad electrodes 175 being spaced apart from each other along the second direction D2.

In example embodiments, the gate electrode 170 and the first pad electrode 175 may be simultaneously (or concurrently) formed using the same material, e.g., in a same process stage. For example, the first pad electrode 175 may include gold (Au), silver (Ag), aluminum (Al), platinum (Pt), nickel (Ni), titanium (Ti), palladium (Pd), magnesium (Mg), calcium (Ca), lithium (Li), chrome (Cr), tantalum (Ta), tungsten (W), copper (Cu), molybdenum (Mo), scandium (Sc), neodymium (Nd), iridium (Ir), an alloy of aluminum, aluminum nitride ($AlN_x$), an alloy of silver, tungsten nitride ($WN_x$), an alloy of copper, an alloy of molybdenum, titanium nitride (TiNx), chrome nitride ($CrN_x$), tantalum nitride ($TaN_x$), strontium ruthenium oxide (SRO), zinc oxide ($ZnO_x$), indium tin oxide (ITO), stannum oxide ($SnO_x$), indium oxide ($InO_x$), gallium oxide ($GaO_x$), indium zinc oxide (IZO), etc. These may be used alone or in a suitable combination thereof. Alternatively, the first pad electrode 175 may have a multi-layered structure.

The insulating interlayer 190 may be disposed on the gate electrode 170. The insulating interlayer 190 may cover the gate electrode 170 in the display region 10, and may extend along the first direction D1 on the substrate 110. The insulating interlayer 190 may cover the gate electrode 170 on the gate insulation layer 150, and may be disposed as a substantially uniform thickness along a profile of the gate electrode 170. That is, the insulating interlayer 190 may be entirely disposed in the display region 10 on the gate insulation layer 150. Alternatively, the insulating interlayer 190 may sufficiently cover the gate electrode 170 on the gate insulation layer 150, and may have a substantially level surface without a step around the gate electrode 170. The insulating interlayer 190 may include organic materials or in organic materials. In example embodiments, the insulating interlayer 190 may include inorganic materials, e.g., silicon compound, metal oxide, etc.

The first insulation layer 195 may be disposed on the first pad electrode 175. As illustrated in FIG. 4, the first insulation layer 195 may cover both lateral portions, e.g., opposite edges along the second direction D2, of the first pad electrode 175, and may expose a portion of an upper surface of the first pad electrode 175. In example embodiments, the insulating interlayer 190 and the first insulation layer 195 may be simultaneously formed using the same material, e.g., the insulating interlayer 190 and the first insulation layer 195 may be portions of a single and continuous insulating layer. That is, the insulating interlayer 190 may be defined as the first insulation layer 195 in the pad region 20. For example, the first insulation layer 195 may include silicon oxide ($SiO_x$), silicon nitride ($SiN_x$), silicon oxynitride ($SiO_xN_y$), silicon oxycarbide ($SiO_xC_y$), silicon carbon nitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), etc.

The source electrode 210 and the drain electrode 230 may be disposed in the display region 10 on the insulating interlayer 190. The source electrode 210 may be in direct contact with a first side of the active layer 130 via a contact hole formed by removing a portion of the gate insulation layer 150 and the insulating interlayer 190. The drain electrode 230 may be in direct contact with a second side of the active layer 130 via a contact hole formed by removing another portion of the gate insulation layer 150 and the insulating interlayer 190. The source electrode 210 and the drain electrode 230 may include, e.g., a metal, an alloy, metal nitride, conductive metal oxide, transparent conductive materials, etc. These may be used alone or in a suitable combination thereof. In some example embodiments, each of the source and drain electrodes 210 and 230 may have a multi-layered structure. Accordingly, the semiconductor element 250 including the active layer 130, the gate insulation layer 150, the gate electrode 170, the insulating interlayer 190, the source electrode 210, and the drain electrode 230 may be disposed.

In example embodiments, the semiconductor element 250 has a top gate structure, but not being limited thereto. For example, in some example embodiments, the semiconductor element 250 may have a bottom gate structure.

The second pad electrode 240 may be disposed in the pad region 20 on the first pad electrode 175 and the first insulation layer 195. In example embodiments, the second pad electrode 240 may have a step portion 305 in a portion where the first pad electrode 175 and the first insulation layer 195 are overlapped. That is, the second pad electrode 240 may be in direct contact with the first pad electrode 175, and may be in direct contact with a portion of an upper surface of the first insulation layer 195. In addition, the second pad electrode 240, the source electrode 210, and the drain electrode 230 may be simultaneously formed using the same material. For example, the second pad electrode 240 may include Au, Ag, Al, Pt, Ni, Ti, Pd, Mg, Ca, Li, Cr, Ta, W, Cu, Mo, Sc, Nd, Ir, an alloy of aluminum, $AlN_x$, an alloy of silver, $WN_x$, an alloy of copper, an alloy of molybdenum, TiNx, $CrN_x$, $TaN_x$, SRO, $ZnO_x$, ITO, $SnO_x$, $InO_x$, $GaO_x$, IZO, etc. These may be used alone or in a suitable combination thereof. In example embodiments, the second pad electrode 240 may have a multi-layered structure.

For example, the second pad electrode 240 may have a stack electrode structure including Ti/Al/Ti. As illustrated in FIG. 5, the second pad electrode 240 may include a first stack electrode layer 241, a second stack electrode layer 242, and a third stack electrode layer 243. Here, the first stack electrode layer 241 and the third stack electrode layer 243 may include Ti, and the second stack electrode layer 242 may include Al. In addition, the first stack electrode layer 241 and the third stack electrode layer 243 may have a first thickness, and the second stack electrode layer 242 may have a second thickness that is greater than the first thickness.

Referring again to FIGS. 3 and 4, the planarization layer 270 may be disposed on the source electrode 210 and the drain electrode 230. The planarization layer 270 may cover the source electrode 210 and the drain electrode 230 in the display region 10, and may extend along the first direction D1 on the insulating interlayer 190. That is, the planarization layer 270 may be entirely disposed in the display region 10 on the insulating interlayer 190. In example embodiments, the planarization layer 270 may be disposed at a high thickness to sufficiently cover the source and drain electrodes 210 and 230. In this case, the planarization layer 270 may have a substantially flat upper surface, and a planarization process may be further performed on the planarization layer 270 to implement the flat upper surface of the planarization layer 270. Alternatively, the planarization layer 270 may cover the source and drain electrodes 210 and 230, and may be disposed as a substantially uniform thickness along a profile of the source and drain electrodes 210 and 230. The planarization layer 270 may include organic materials or inorganic materials. In example embodiments, the planarization layer 270 may include organic materials.

The lower electrode 290 may be disposed in the display region 10 on the planarization layer 270. The lower electrode 290 may be in contact with the drain electrode 230 via a contact hole formed by removing a portion of the planarization layer 270. In addition, the lower electrode 290 may be electrically connected to the semiconductor element 250. The lower electrode 290 may include, e.g., a metal, a metal alloy, metal nitride, conductive metal oxide, transparent conductive materials, etc. These may be used alone or in a suitable combination thereof. In some example embodiments, the lower electrode 290 may have a multi-layered structure.

In the pad region 20, the third pad electrode 295 may be disposed on the first insulation layer 195 and the second pad electrode 240. In example embodiments, the third pad electrode 295 may completely cover the second pad electrode 240 such that the second pad electrode 240 is not exposed, e.g., the third pad electrode 295 may completely cover all outer surfaces of the second pad electrode 240. For example, a distal end portion of the third pad electrode 295 may be in contact with a portion of an upper surface of the first insulation layer 195 such that the third pad electrode 295 completely covers the second pad electrode 240. In addition, the third pad electrode 295 and the lower electrode 290 may be simultaneously formed using the same material. For example, the third pad electrode 295 may include Au, Ag, Al, Pt, Ni, Ti, Pd, Mg, Ca, Li, Cr, Ta, W, Cu, Mo, Sc, Nd, Ir, an alloy of aluminum, $AlN_x$, an alloy of silver, $WN_x$, an alloy of copper, an alloy of molybdenum, TiNx, $CrN_x$, $TaN_x$, SRO, $ZnO_x$, ITO, $SnO_x$, $InO_x$, $GaO_x$, IZO, etc. These may be used alone or in a suitable combination thereof.

In example embodiments, the third pad electrode 295 may have a multi-layered structure. For example, the third pad electrode 295 may have a stack electrode structure including ITO/Ag/ITO. As illustrated in FIG. 5, the third pad electrode 295 may include a fourth stack electrode layer 296, a fifth stack electrode layer 297, and a sixth stack electrode layer 298. Here, the fourth stack electrode layer 296 and the sixth stack electrode layer 298 may include ITO, and the fifth stack electrode layer 297 may include Ag. In addition, the fourth stack electrode layer 296 and the sixth stack electrode layer 298 may have a third thickness, and the fifth stack electrode layer 247 may have a fourth thickness that is greater than the third thickness.

For example, a preliminary electrode layer may be formed on the entire substrate 110. In the display region 10, the preliminary electrode layer may be formed on the planarization layer 270. In addition, in the pad region 20, the preliminary electrode layer may be formed on the first insulation layer 195 and the second pad electrode 240. A photoresist may be disposed on a portion where the lower electrode 290 and the third pad electrode 295 are to be formed, and the preliminary electrode layer may be etched with an etchant. In this case, since the preliminary electrode layer (as well as the photoresist indicating the resultant third pad electrode 295) completely cover the second pad electrode 240, the third pad electrode 295 protects the second pad electrode 240 from the etchant. When the third pad electrode 295 does not cover the second pad electrode 240 in the pad region 20, Ag ions generated from the lower electrode 290 react with Ti of the second pad electrode 240 during the wet etching process, such that the second pad electrode 240 may be damaged. In addition, the pad electrode structures 300 may be shorted (e.g., cut, broken, etc.) in a reliability of the OLED display device 100. Thus, to prevent damage of the second pad electrode 240 from the etchant, the third pad electrode 295 completely covers the second pad electrode 240.

The pixel defining layer 310 may be disposed in the display region 10 on the planarization layer 270, and may expose a portion of the lower electrode 290. The pixel defining layer 310 may include organic materials or inorganic materials. In example embodiments, the pixel defining layer 310 may include organic materials.

The second insulation layer 315 may cover both lateral portions of the third pad electrode 295 in the pad region 20. For example, the second insulation layer 315 may be disposed on a portion of the third pad electrode 295 and the first insulation layer 195 such that the distal end portion of the third pad electrode 295 is not exposed. That is, the second insulation layer 315 may be disposed to protect the distal end portion of the third pad electrode 295. In example embodiments, the second insulation layer 315 and the pixel defining layer 310 may be simultaneously formed using the same material. For example, the second insulation layer 315 may include. e.g., a polyimide-based resin, a photoresist, an acryl-based resin, a polyamide-based resin, a siloxane-based resin, etc.

In example embodiments, a first height from the substrate 110 into an upper surface of the second insulation layer 315 (e.g. a height extending along a third direction D3 that is vertical to the first and second directions D1 and D2) may be less than a second height from the substrate 110 into an upper surface of the third pad electrode 295 that is disposed on the step portion 305. That is, an uppermost surface of the third pad electrode 295 may be higher than an uppermost surface of the second insulation layer 315 relative to a bottom of the substrate 110.

For example, the pad electrode structure 300 and an anisotropic conductive film (ACF) may be bonded by using the ACF such that the external device 101 is electrically connected to the pad electrode structure 300. Accordingly, as the first height may be less than the second height, a conductive ball included in the ACF may be in contact with the uppermost surface of the third pad electrode 295. Thus, the external device 101 and the pad electrode structure 300 may be electrically connected via the ACF on the uppermost surface of the third pad electrode 295. On the contrary, if the first height were to be greater than the second height (if the uppermost surface of the second insulation layer 315 were to be higher than that of the third pad electrode 295), the conductive ball could not make proper contact with the third pad electrode 295 because of the higher second insulation layer 315, thereby causing the external device 101 not to be electrically connected to the pad electrode structure 300.

As described above, the pixel defining layer 310 and the second insulation layer 315 may be simultaneously formed using the same material. Meanwhile, a thickness (e.g., a thickness extending along the third direction D3) of the pixel defining layer 310 may be different from a thickness of the second insulation layer 315. For example, the second insulation layer 315 may be formed using a half tone mask such that the second insulation layer 315 has the first height. Thus, a thickness of the second insulation layer 315 may be relatively less than a thickness of the pixel defining layer 310.

Accordingly, the pad electrode structure 300 including the first pad electrode 175, the first insulation layer 195, the second pad electrode 240, the third pad electrode 295, and the second insulation layer 315 may be disposed.

The light emitting layer 330 may be disposed in a portion where an upper surface of the lower electrode 290 is exposed by the pixel defining layer 310. The light emitting layer 330 may have a multi-layered structure including an organic emission layer (EL), a hole injection layer (HIL), a hole transfer layer (HTL), an electron transfer layer (ETL), and an electron injection layer (EIL). The HIL, the HTL, the EL, the ETL, and the EIL may be sequentially disposed between the lower electrode 290 and the upper electrode 340. The EL of the light emitting layer 330 may be formed using at least one of light emitting materials capable of generating different colors of light (e.g., a red color of light, a blue color of light, and a green color of light) according to sub-pixels. Alternatively, the EL of the light emitting layer 330 may generally generate a white color of light by stacking a plurality of light emitting materials capable of generating different colors of light such as a red color of light, a green color of light, and a blue color of light. In this case, a color filter may be disposed on the light emitting layer 330. The color filter may include at least one of a red color filter, a green color filter, and a blue color filter. Alternatively, the color filter may include a yellow color filter, a cyan color filter, and a magenta color filter. The color filter may include a photosensitive resin or a color photoresist.

The upper electrode 340 may be disposed on the pixel defining layer 310 and the light emitting layer 330. The upper electrode 340 may cover the pixel defining layer 310 and the light emitting layer 330 in the display region 10, and may extend along the first direction D1 on the substrate 110. That is, the upper electrode 340 may be entirely disposed in the display region 10 on the substrate 110. The upper electrode 340 may include, e.g., a metal, a metal alloy, metal nitride, conductive metal oxide, transparent conductive materials, etc. Accordingly, the display structure 200 including the lower electrode 290, the light emitting layer 330, and the upper electrode 340 may be disposed.

The encapsulation substrate 350 may be disposed on the upper electrode 340. The encapsulation substrate 350 and the substrate 110 may include substantially the same material. For example, the encapsulation substrate 350 may include, e.g., a quartz substrate, a synthetic quartz substrate, a calcium fluoride substrate, a fluoride-doped quartz substrate, a sodalime glass substrate, a non-alkali glass substrate, etc. In some example embodiments, the encapsulation substrate 350 may include a transparent inorganic material or flexible plastic. For example, the encapsulation substrate 350 may include a flexible transparent resin substrate. In this case, to increase flexibility of the OLED display device 100, the encapsulation substrate 350 may include a stacked structure where at least one inorganic layer and at least one organic layer are alternately stacked.

The OLED display device 100 in accordance with example embodiments includes the pad electrode structure 300 with the third pad electrode 295, e.g., completely, covering the second pad electrode 240. Accordingly, the second pad electrode 240 is protected by the third pad electrode 295 from an etchant used in a subsequent process for forming the lower electrode 290 of the display structure 200.

FIGS. 6 to 16 are cross-sectional views of stages in a method of manufacturing an OLED display device in accordance with example embodiments.

Figure 6:
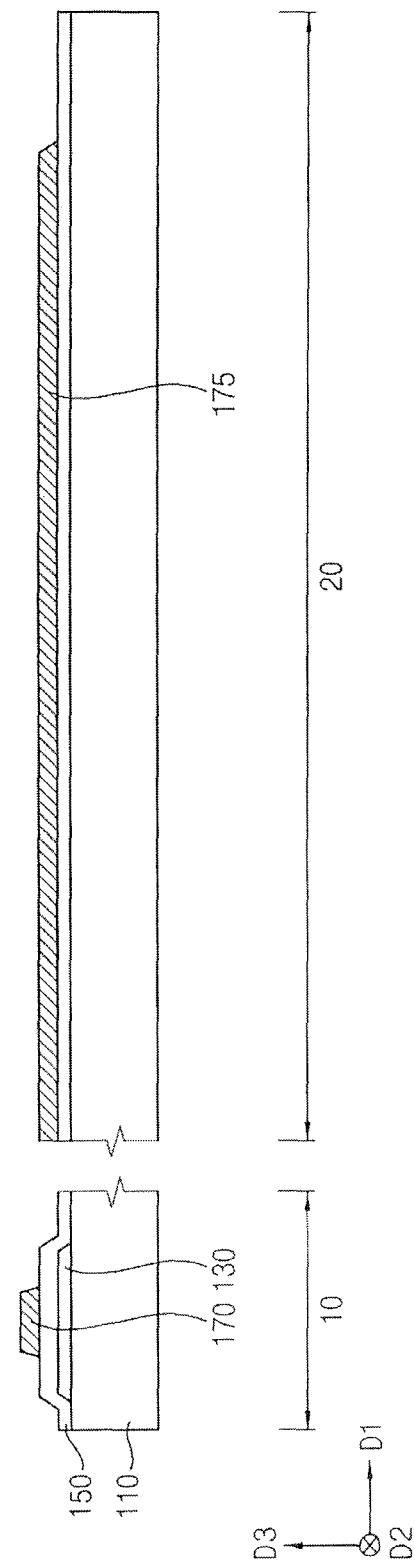
FIGS. 6-16 illustrate cross-sectional views of stages in a method of manufacturing an OLED display device in accordance with example embodiments.
Figure 7:
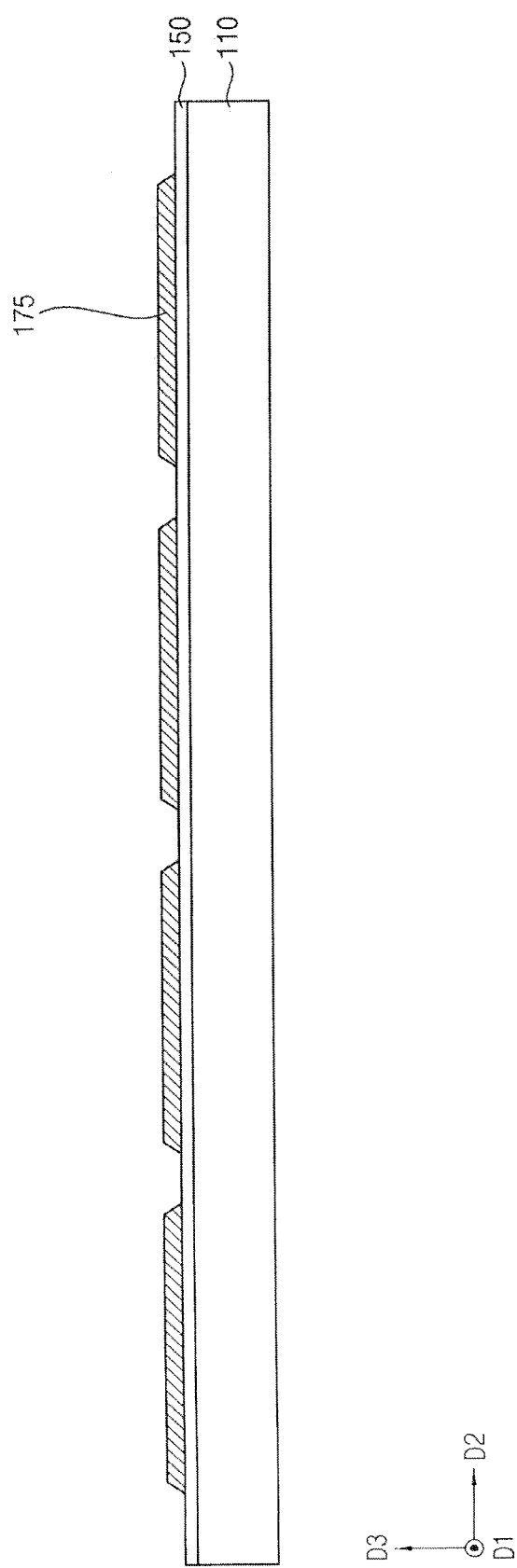

Referring to FIGS. 6 and 7, which illustrate views along respective lines I-I' and II-II' of FIG. 1, the substrate 110 may be provided. The substrate 110 may include transparent materials. For example, the substrate 110 may be formed using a quartz substrate, a synthetic quartz substrate, a calcium fluoride substrate, a fluoride-doped quartz substrate, a sodalime glass substrate, a non-alkali glass substrate etc. Alternatively, the substrate 110 may include a flexible transparent material such as a flexible transparent resin substrate (e.g., a polyimide substrate). For example, the polyimide substrate may include a first polyimide layer, a barrier film layer, a second polyimide layer, etc. Since the polyimide substrate is relatively thin and flexible, the polyimide substrate may be formed on a rigid glass substrate to help support the formation of an upper structure (e.g., a semiconductor element, a display structure, etc.). That is, the substrate 110 may have a structure in which the first polyimide layer, the barrier film layer and the second polyimide layer are stacked on the rigid glass substrate. In a manufacturing the OLED display device, after an insulating layer (e.g., a buffer layer) is provided on the second polyimide layer of the polyimide substrate, the upper structure may be formed on the buffer layer. After the upper structure is formed on the buffer layer, the rigid glass substrate on which the polyimide substrate is formed may be removed. It may be difficult to directly form the upper structure on the polyimide substrate because the polyimide substrate is relatively thin and flexible. Accordingly, the upper structure is formed on the polyimide substrate and the rigid glass substrate, and then the polyimide substrate may serve as the substrate 110 of the OLED display device after the removal of the rigid glass substrate. Since the OLED display device includes a display region 10 and a pad region 20, and the substrate 110 may also include the display region 10 and the pad region 20.

A buffer layer may be formed on the substrate 110. The buffer layer may be formed on the entire substrate 110. The buffer layer may prevent the diffusion of metal atoms and/or impurities from the substrate 110 into the semiconductor element. Additionally, the buffer layer may control a rate of a heat transfer in a crystallization process for forming an active layer, thereby obtaining substantially uniform the active layer. Furthermore, the buffer layer may improve a surface flatness of the substrate 110 when a surface of the substrate 110 is relatively irregular. According to a type of the substrate 110, at least two buffer layers may be provided on the substrate 110, or the buffer layer may not be formed. For example, the buffer layer may be formed using organic materials or inorganic materials.

The active layer 130 may be formed on the substrate 110. For example, the active layer 130 may be formed in the display region 10 on the substrate 110, and may be formed using an oxide semiconductor, an inorganic semiconductor, an organic semiconductor, etc.

The gate insulation layer 150 may be formed on the active layer 130. The gate insulation layer 150 may cover the active layer 130 in the display region 10, and may extend along the first direction D1 on the substrate 110. Here, the first direction D1 may be parallel to an upper surface of the substrate 110. That is, the gate insulation layer 150 may be entirely formed in the display region 10 and the pad region 20 on the substrate 110. The gate insulation layer 150 may cover the active layer 130 on the substrate 110, and may be formed at a substantially uniform thickness along a profile of the active layer 130. Alternatively, the gate insulation layer 150 may sufficiently cover the active layer 130 on the substrate 110, and may have a substantially level surface without a step around the active layer 130. The gate insulation layer 150 may include organic materials or inorganic materials. In example embodiments, the gate insulation layer 150 may be formed using inorganic materials, e.g., silicon compound, metal oxide, etc. In some example embodiments, the gate insulation layer 150 may be formed only in the display region 10, and may expose the pad region 20.

The gate electrode 170 may be formed on a portion of the gate insulation layer 150 under which the active layer 130 is located. The gate electrode 170 may be formed using, e.g., a metal, a metal alloy, metal nitride, conductive metal oxide, transparent conductive materials, etc. These may be used alone or in a suitable combination thereof.

The first pad electrode 175 may be formed in the pad region 20 on the gate insulation layer 150. The first pad electrode 175 may be electrically connected to a wiring formed in the peripheral region 40 (refer to FIG. 1), and may extend along the first direction D1 from the peripheral region 40 into the pad region 20. That is, an external device 101 (refer to FIG. 2) may provide data signals, scan signals, light emission signals, power supply voltages, etc. to the wirings formed in the peripheral region 40 through the first pad electrode 175. In example embodiments, the gate electrode 170 and the first pad electrode 175 may be simultaneously formed using the same material. For example, a preliminary electrode layer may be formed on the entire substrate 110, e.g., on both the display region 10 and the pad region 20, and the gate electrode 170 and the first pad electrode 175 may be formed on the display region 10 and the pad region 20, respectively, by partially removing the preliminary electrode layer. The first pad electrode 175 may be formed using Au, Ag, Al, Pt, Ni, Ti, Pd, Mg, Ca, Li, Cr, Ta, W, Cu, Mo, Sc, Nd, Ir, an alloy of aluminum, $AlN_x$, an alloy of silver, $WN_x$, an alloy of copper, an alloy of molybdenum, $TiN_x$, $CrN_x$, $TaN_x$, SRO, $ZnO_x$, ITO, $SnO_x$, $InO_x$, $GaO_x$, IZO, etc. These may be used alone or in a suitable combination thereof. In example embodiments, the first pad electrode 175 may have a multi-layered structure.

Figure 8:
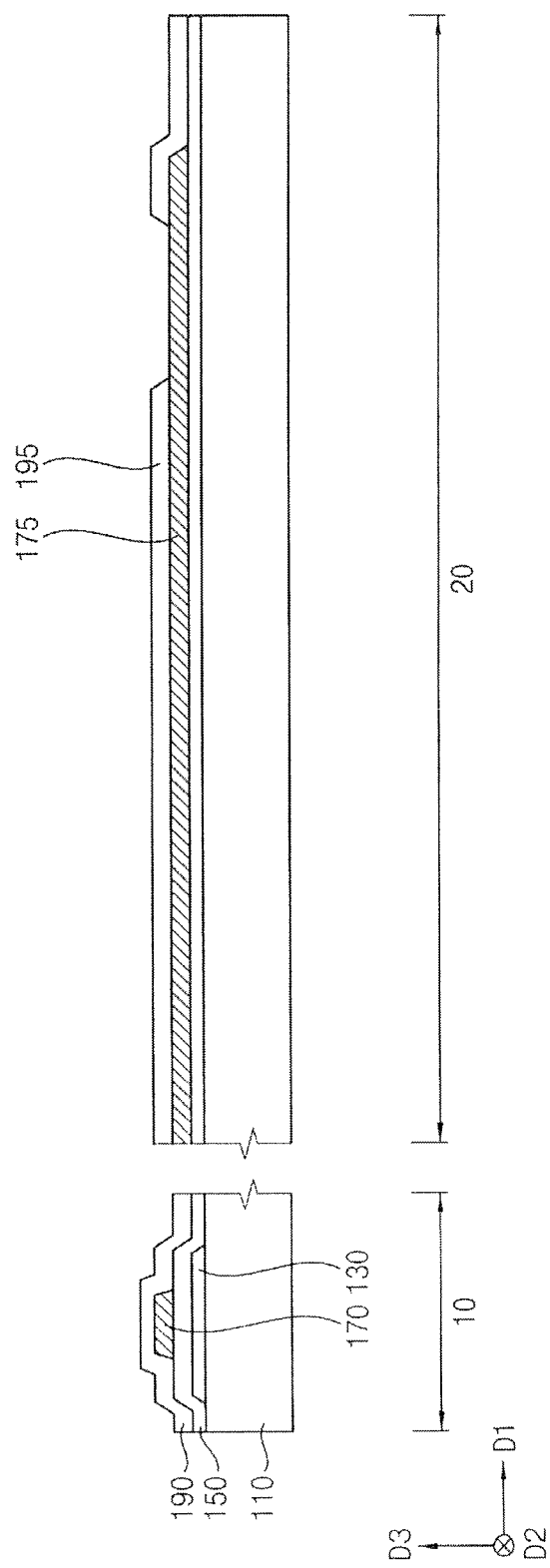
Figure 9:
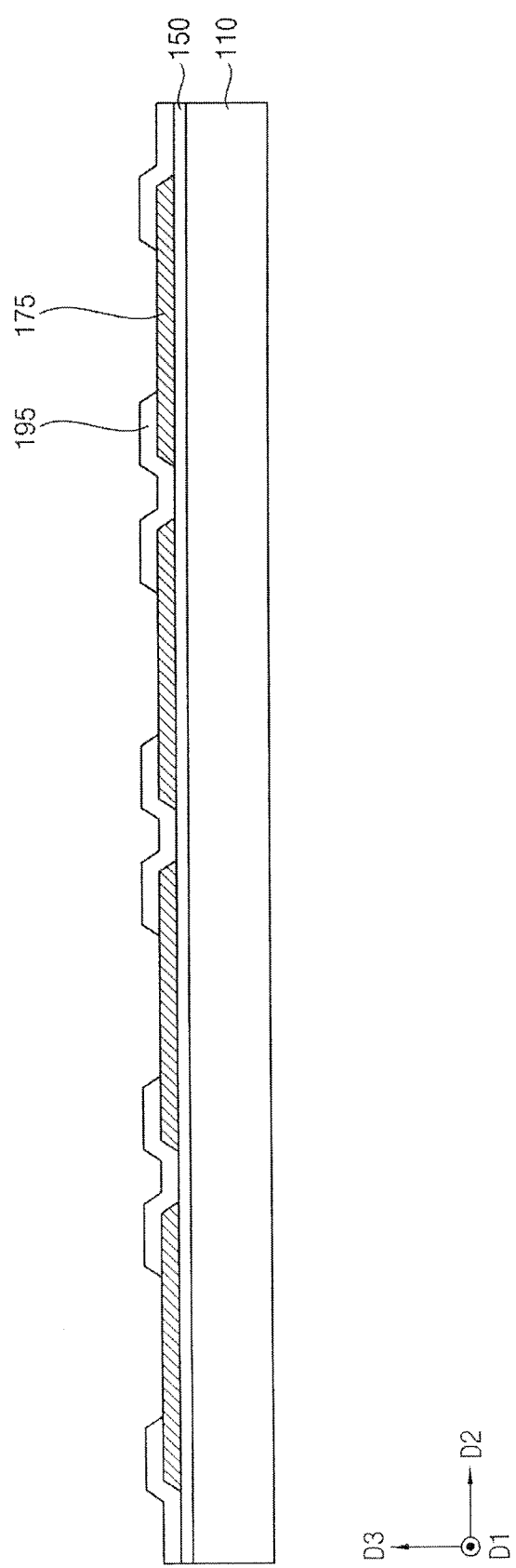

Referring to FIGS. 8 and 9, which illustrate views along respective lines I-I' and II-II' of FIG. 1, the insulating interlayer 190 may be formed on the gate electrode 170. The insulating interlayer 190 may cover the gate electrode 170 in the display region 10, and may extend along the first direction D1 on the substrate 110. The insulating interlayer 190 may cover the gate electrode 170 on the gate insulation layer 150, and may be formed at a substantially uniform thickness along a profile of the gate electrode 170. That is, the insulating interlayer 190 may be entirely formed in the display region 10 on the gate insulation layer 150. Alternatively, the insulating interlayer 190 may sufficiently cover the gate electrode 170 on the gate insulation layer 150, and may have a substantially level surface without a step around the gate electrode 170. The insulating interlayer 190 may include organic materials or inorganic materials. In example embodiments, the insulating interlayer 190 may be formed using inorganic materials such as silicon compound, metal oxide, etc.

The first insulation layer 195 may be formed on the first pad electrode 175. As illustrated in FIG. 9, the first insulation layer 195 may cover both lateral portions of the first pad electrode 175, and may expose a portion of an upper surface of the first pad electrode 175. In example embodiments, the insulating interlayer 190 and the first insulation layer 195 may be simultaneously formed using the same material. That is, the insulating interlayer 190 may be defined as the first insulation layer 195 in the pad region 20. For example, a preliminary insulation layer may be formed on the entire substrate 110, e.g., on both the display region 10 and the pad region 20, and the insulating interlayer 190 and the first insulation layer 195 may be formed on the display region 10 and the pad region 20, respectively, by partially removing the preliminary insulation layer. The first insulation layer 195 may be formed using $SiO_x$, $SiN_x$, $SiO_xN_y$, $SiO_xC_y$, $SiC_xN_y$, $AlO_x$, $AlN_x$, $TaO_x$, $HfO_x$, $ZrO_x$, $TiO_x$, etc.

Figure 10:
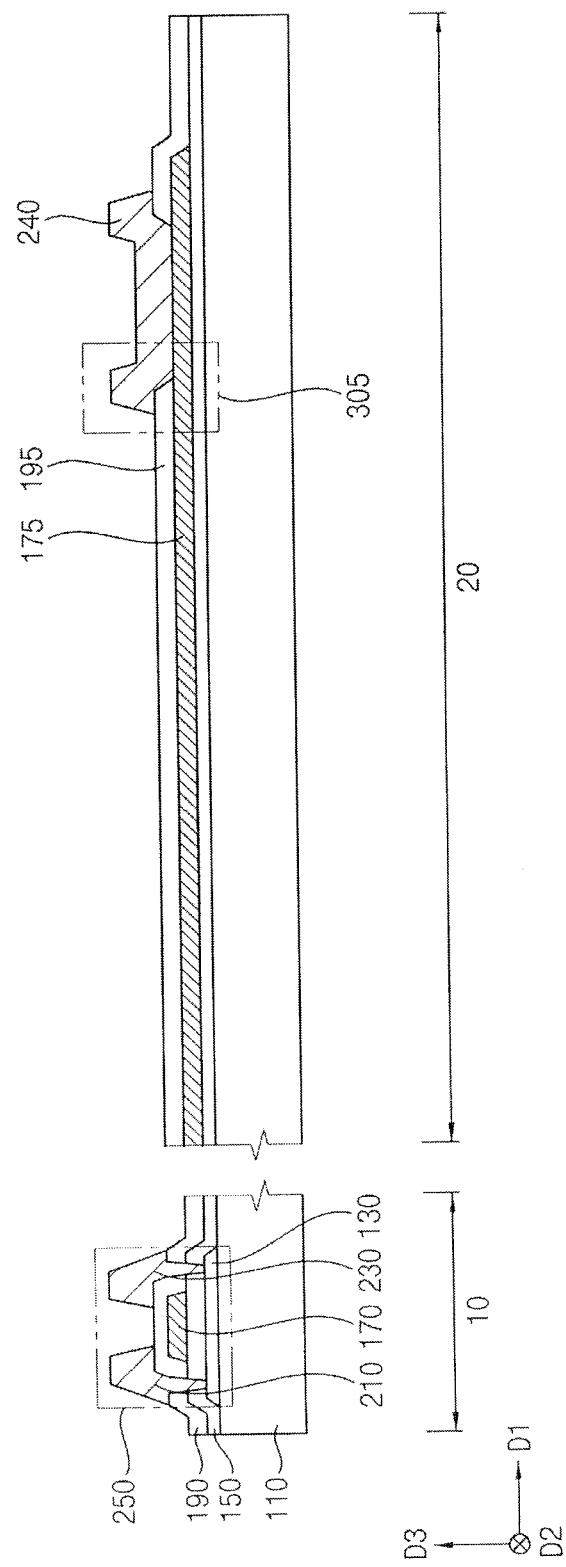
Figure 11:
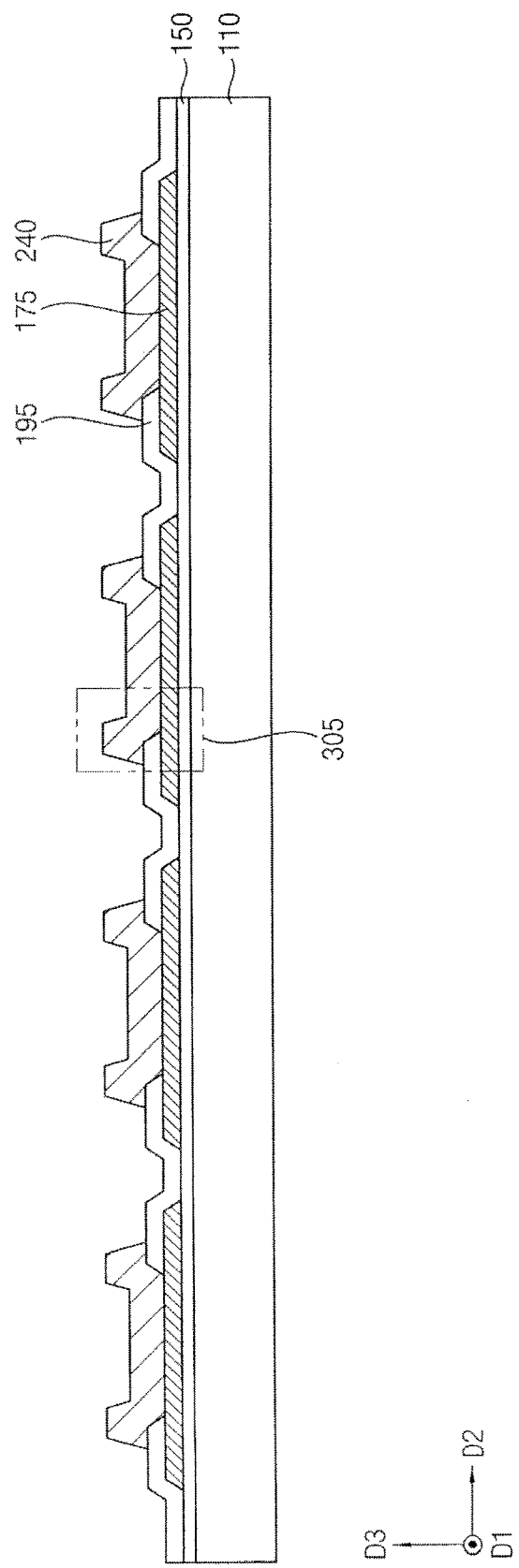

Referring to FIGS. 10 and 11, which illustrate views along respective lines I-I' and II-II' of FIG. 1, the source electrode 210 and the drain electrode 230 may be disposed in the display region 10 on the insulating interlayer 190. The source electrode 210 may be in directly contact with a first side of the active layer 130 via a contact hole formed by removing a portion of the gate insulation layer 150 and the insulating interlayer 190. The drain electrode 230 may be in directly contact with a second side of the active layer 130 via a contact hole formed by removing another portion of the gate insulation layer 150 and the insulating interlayer 190. The source electrode 210 and the drain electrode 230 may be formed using a metal, an alloy, metal nitride, conductive metal oxide, transparent conductive materials, etc. These may be used alone or in a suitable combination thereof. In some example embodiments; each of the source and drain electrodes 210 and 230 may have a multi-layered structure. Accordingly, a semiconductor element 250 including the active layer 130, the gate insulation layer 150, the gate electrode 170, the insulating interlayer 190, the source electrode 210, and the drain electrode 230 may be formed.

The second pad electrode 240 may be formed in the pad region 20 on the first pad electrode 175 and the first insulation layer 195. In example embodiments, the second pad electrode 240 may have the step portion 305 in a portion where the first pad electrode 175 and the first insulation layer 195 are overlapped. That is, the second pad electrode 240 may be in direct contact with the first pad electrode 175, and may be in direct contact with a portion of an upper surface of the first insulation layer 195. In addition, the second pad electrode 240, the source electrode 210, and the drain electrode 230 may be simultaneously formed using the same material. For example, a preliminary electrode layer may be formed on the entire substrate 110, and the source electrode 210, the drain electrode 230, and the second pad electrode 240 may be formed by partially removing the preliminary electrode layer. The second pad electrode 240 may be formed using Au, Ag, Al, Pt, Ni, Ti, Pd, Mg, Ca, Li, Cr, Ta, W, Cu, Mo, Sc, Nd, Ir, an alloy of aluminum, AlNx, an alloy of silver, $WN_x$, an alloy of copper, an alloy of molybdenum, $TiN_x$, $CrN_x$, $TaN_x$, SRO, $ZnO_x$, ITO, $SnO_x$, $InO_x$, $GaO_x$, IZO, etc. These may be used alone or in a suitable combination thereof. In example embodiments, the second pad electrode 240 may have a multi-layered structure. For example, the second pad electrode 240 may have a stack electrode structure including Ti/Al/Ti (refer to FIG. 5).

Figure 12:
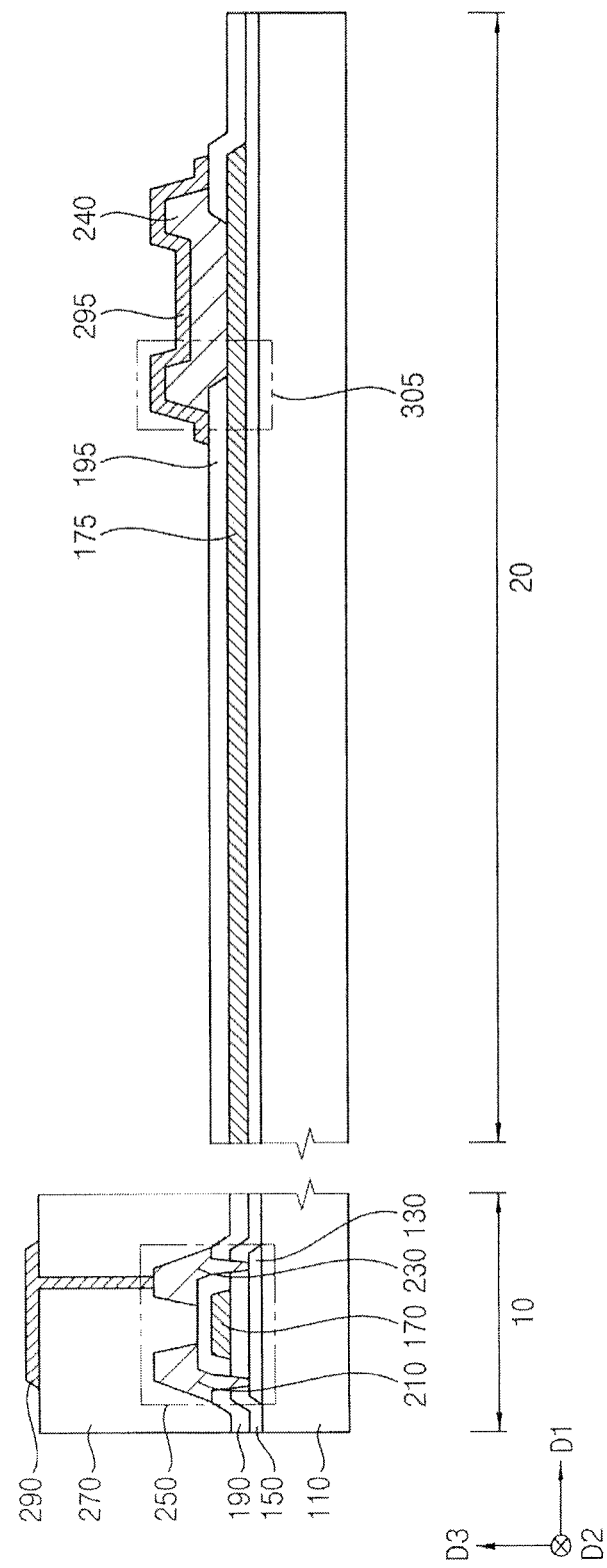
Figure 13:
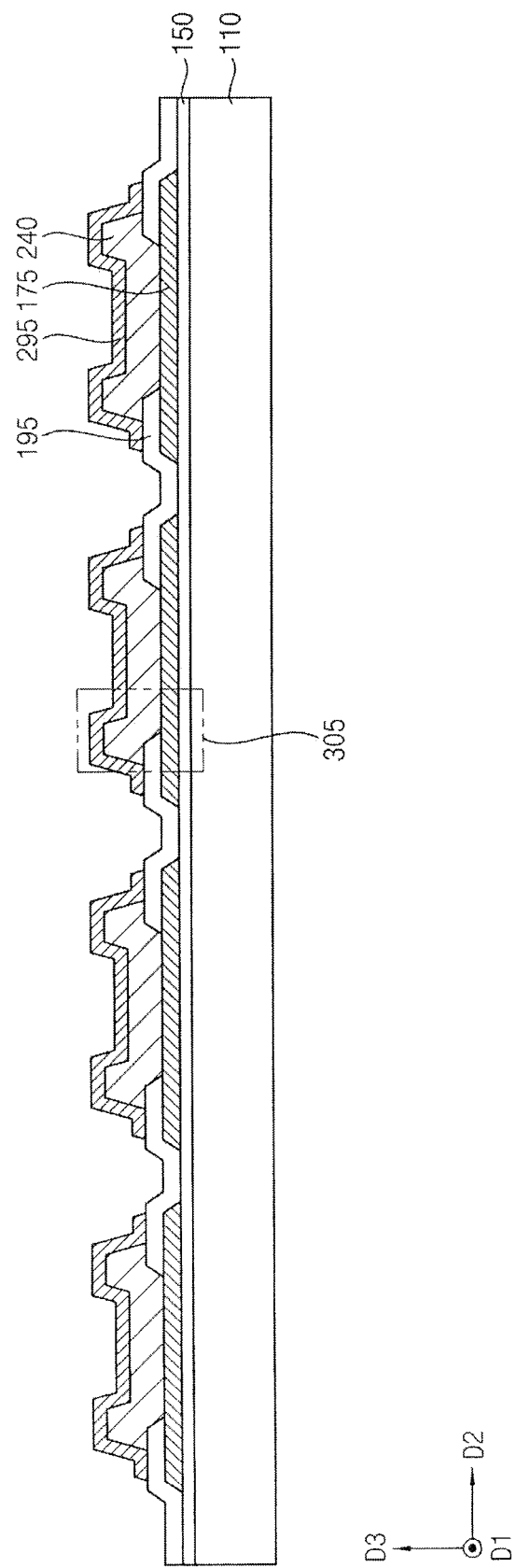

Referring to FIGS. 12 and 13, which illustrate views along respective lines I-I' and II-II' of FIG. 1, the planarization layer 270 may be formed on the source electrode 210 and the drain electrode 230. The planarization layer 270 may cover the source electrode 210 and the drain electrode 230 in the display region 10, and may extend along the first direction D1 on the insulating interlayer 190. That is, the planarization layer 270 may be entirely formed in the display region 10 on the insulating interlayer 190. In example embodiments, the planarization layer 270 may be disposed as a high thickness to sufficiently cover the source and drain electrodes 210 and 230. In this case, the planarization layer 270 may have a substantially flat upper surface, and a planarization process may be further performed on the planarization layer 270 to implement the flat upper surface of the planarization layer 270. Alternatively, the planarization layer 270 may cover the source and drain electrodes 210 and 230, and may be formed as a substantially uniform thickness along a profile of the source and drain electrodes 210 and 230. The planarization layer 270 may include organic materials or inorganic materials. In example embodiments, the planarization layer 270 may be formed using organic materials.

The lower electrode 290 may be formed in the display region 10 on the planarization layer 270. The lower electrode 290 may be in contact with the drain electrode 230 via a contact hole formed by removing a portion of the planarization layer 270. In addition, the lower electrode 290 may be electrically connected to the semiconductor element 250. The lower electrode 290 may be formed using a metal, a metal alloy, metal nitride, conductive metal oxide, transparent conductive materials, etc. These may be used alone or in a suitable combination thereof. In some example embodiments, the lower electrode 290 may have a multi-layered structure.

In the pad region 20, the third pad electrode 295 may be formed on the first insulation layer 195 and the second pad electrode 240. In example embodiments, the third pad electrode 295 may completely cover the second pad electrode 240 such that the second pad electrode 240 is not exposed. For example, a distal end portion of the third pad electrode 295 may be in contact with a portion of an upper surface of the first insulation layer 195 such that the third pad electrode 295 completely covers the second pad electrode 240. In addition, the third pad electrode 295 and the lower electrode 290 may be simultaneously formed using the same material. For example, a preliminary electrode layer may be formed on the entire substrate 110, e.g., on both the display region 10 and the pad region 20, and the lower electrode 290 and the third pad electrode 295 may be simultaneously formed on the display region 10 and the pad region 20, respectively, by partially removing the preliminary electrode layer. The third pad electrode 295 may be formed using Au, Ag, Al, Pt, Ni, Ti, Pd, Mg, Ca, Li, Cr, Ta, W, Cu, Mo, Sc, Nd, Ir, an alloy of aluminum, $AlN_x$, an alloy of silver, $WN_x$, an alloy of copper, an alloy of molybdenum, $TiN_x$, $CrN_x$, $TaN_x$, SRO, $ZnO_x$, ITO, $SnO_x$, $InO_x$, $GaO_x$, IZO, etc. These may be used alone or in a suitable combination thereof. In example embodiments, the third pad electrode 295 may have a multi-layered structure. For example, the third pad electrode 295 may have a stack electrode structure including ITO/Ag/ITO (refer to FIG. 5).

Figure 14:
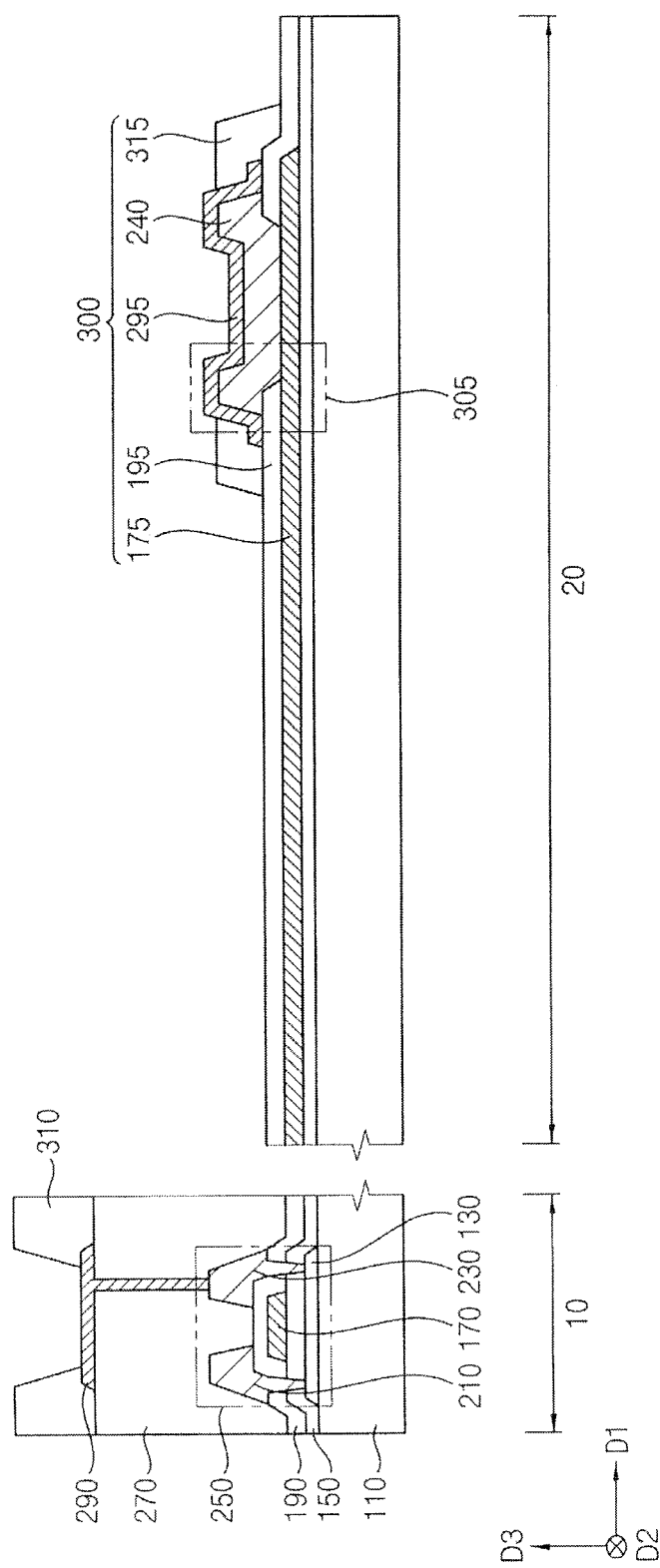
Figure 15:
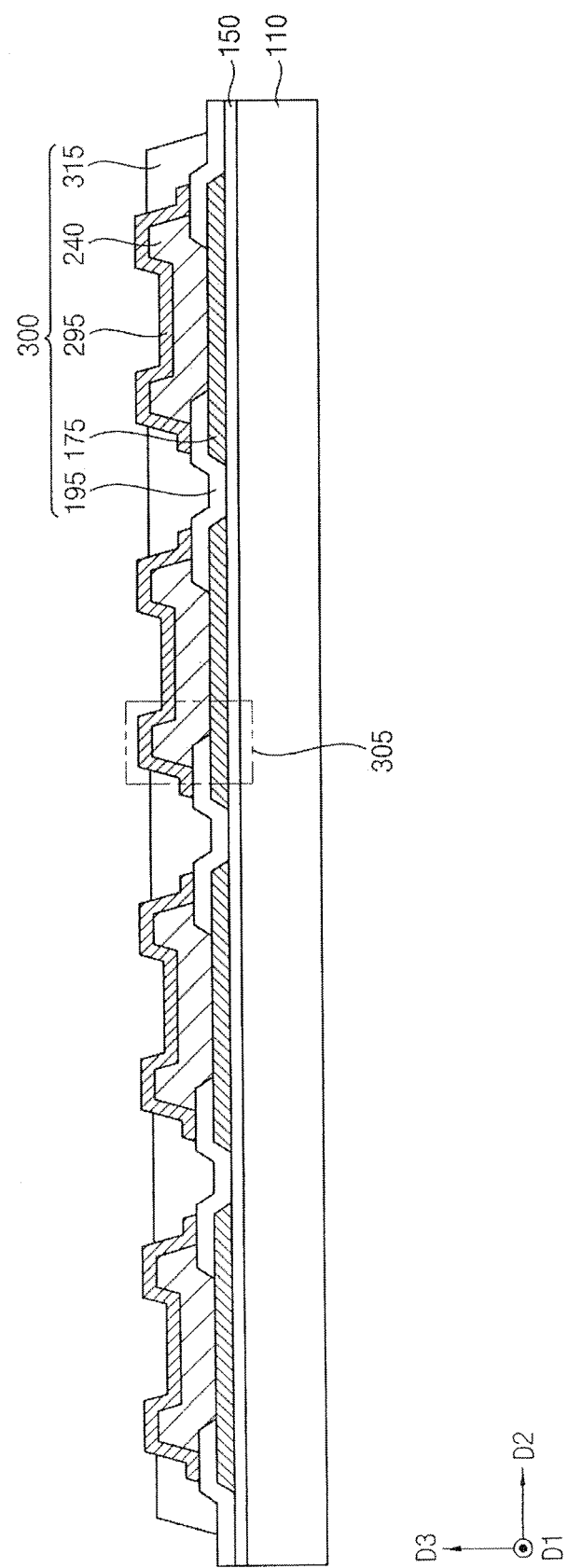

Referring to FIGS. 14 and 15, which illustrate views along respective lines I-I' and II-II' of FIG. 1, the pixel defining layer 310 may be formed in the display region 10 on the planarization layer 270, and may expose a portion of the lower electrode 290. The pixel defining layer 310 may include organic materials or inorganic materials. In example embodiments, the pixel defining layer 310 may be formed using organic materials.

The second insulation layer 315 may cover both lateral portions of the third pad electrode 295 in the pad region 20. For example, the second insulation layer 315 may be formed on a portion of the third pad electrode 295 and the first insulation layer 195 such that the distal end portion of the third pad electrode 295 is not exposed. That is, the second insulation layer 315 may be formed to protect the distal end portion of the third pad electrode 295. In example embodiments, the second insulation layer 315 and the pixel defining layer 310 may be simultaneously formed using the same material. For example, a preliminary insulation layer may be formed on the entire substrate 110, and the pixel defining layer 310 and the second insulation layer 315 may be formed by partially removing the preliminary insulation layer. Here, a height of the second insulation layer 315 may be relatively less than a height of the pixel defining layer 310 by using a half tone mask. The second insulation layer 315 may be formed using a polyimide-based resin, a photoresist, an acryl-based resin, a polyamide-based resin, a siloxane-based resin, etc. Accordingly, the pad electrode structure 300 including the first pad electrode 175, the first insulation layer 195, the second pad electrode 240, the third pad electrode 295, and the second insulation layer 315 may be formed.

Figure 16:
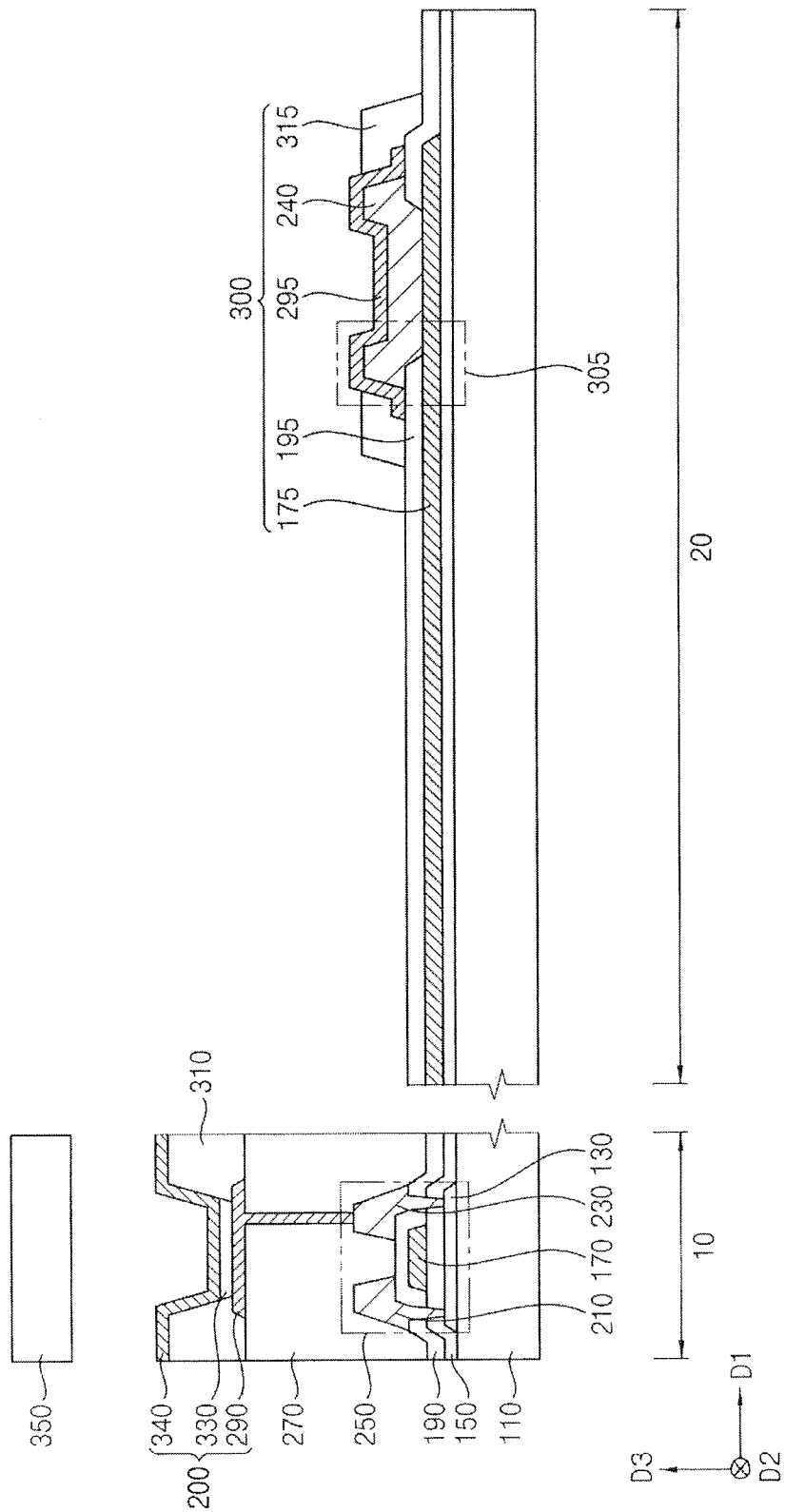

Referring to FIG. 16, the light emitting layer 330 may be formed in a portion where an upper surface of the lower electrode 290 is exposed by the pixel defining layer 310. The light emitting layer 330 may have a multi-layered structure including an EL, an HIL, an HTL, an ETL, and an EIL. The HIL, the HTL, the EL, the ETL, and the EIL may be sequentially formed between the lower electrode 290 and the upper electrode 340. The EL of the light emitting layer 330 may be formed using at least one of light emitting materials capable of generating different colors of light (e.g., a red color of light, a blue color of light, and a green color of light) according to sub-pixels. Alternatively, the EL of the light emitting layer 330 may generally generate a white color of light by stacking a plurality of light emitting materials capable of generating different colors of light such as a red color of light, a green color of light, and a blue color of light. In this case, a color filter may be formed on the light emitting layer 330. The color filter may include at least one selected from a red color filter, a green color filter, and a blue color filter. Alternatively, the color filter may include a yellow color filter, a cyan color filter, and a magenta color filter. The color filter may be formed using a photosensitive resin or a color photoresist.

The upper electrode 340 may be formed on the pixel defining layer 310 and the light emitting layer 330. The upper electrode 340 may cover the pixel defining layer 310 and the light emitting layer 330 in the display region 10, and may extend along the first direction D1 on the substrate 110. That is, the upper electrode 340 may be entirely formed in the display region 10 on the substrate 110. The upper electrode 340 may be formed using a metal, a metal alloy, metal nitride, conductive metal oxide, transparent conductive materials, etc. Accordingly, a display structure 200 including the lower electrode 290, the light emitting layer 330, and the upper electrode 340 may be formed.

The encapsulation substrate 350 may be formed on the upper electrode 340. The encapsulation substrate 350 and the substrate 110 may include substantially the same material. For example, the encapsulation substrate 350 may be formed using a quartz substrate, a synthetic quartz substrate, a calcium fluoride substrate, a fluoride-doped quartz substrate, a sodalime glass substrate, a non-alkali glass substrate, etc. In some example embodiments, the encapsulation substrate 350 may include a transparent inorganic material or flexible plastic. For example, the encapsulation substrate 350 may include a flexible transparent resin substrate. In this case, to increase flexibility of the OLED display device, the encapsulation substrate 350 may include a stacked structure where at least one inorganic layer and at least one organic layer are alternately stacked.

Accordingly, the OLED display device 100 illustrated in FIGS. 3 and 4 may be manufactured.

Figure 17:
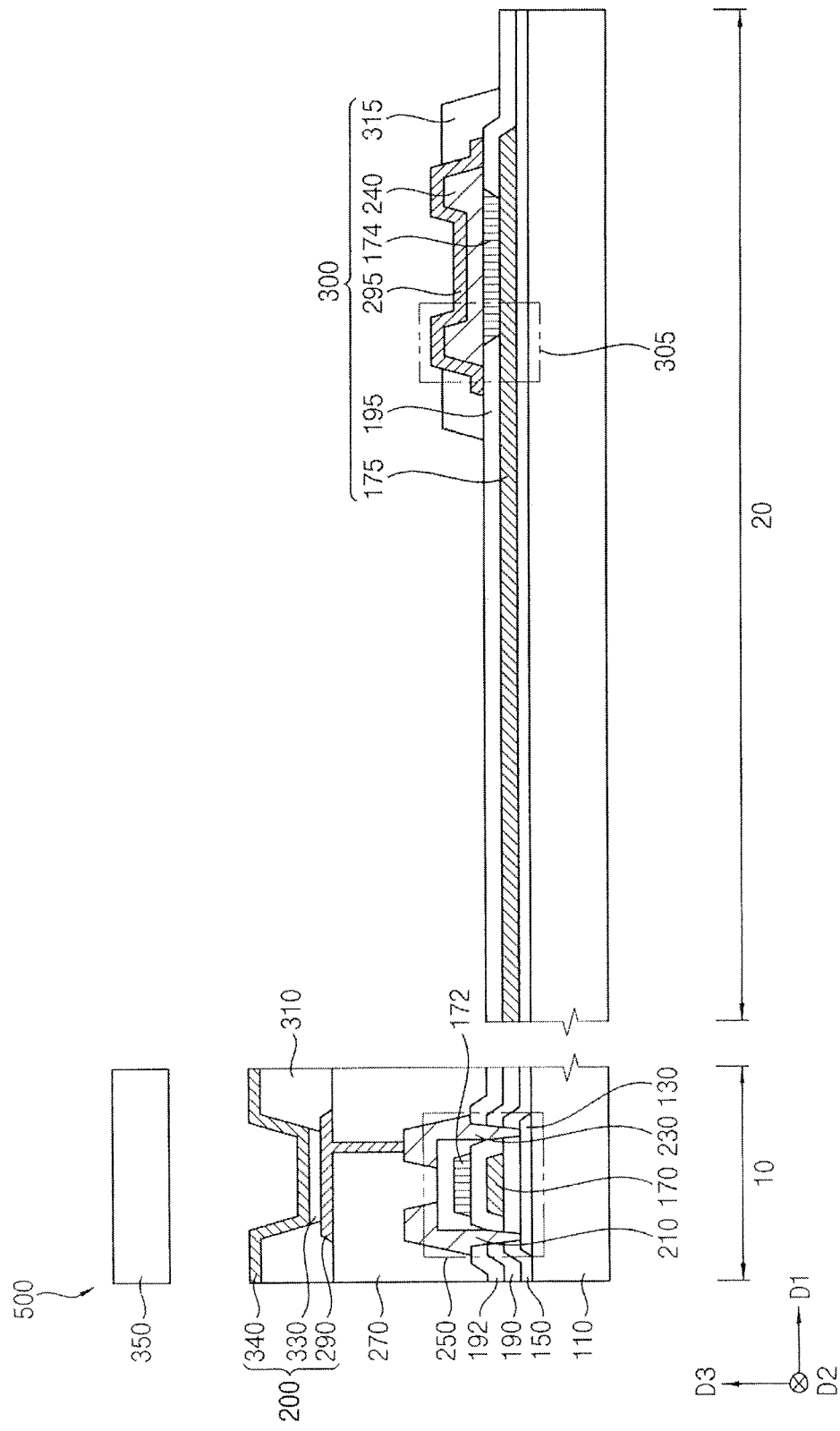
FIG. 17 illustrates a cross-sectional view of an OLED display device in accordance with example embodiments.
Figure 18:
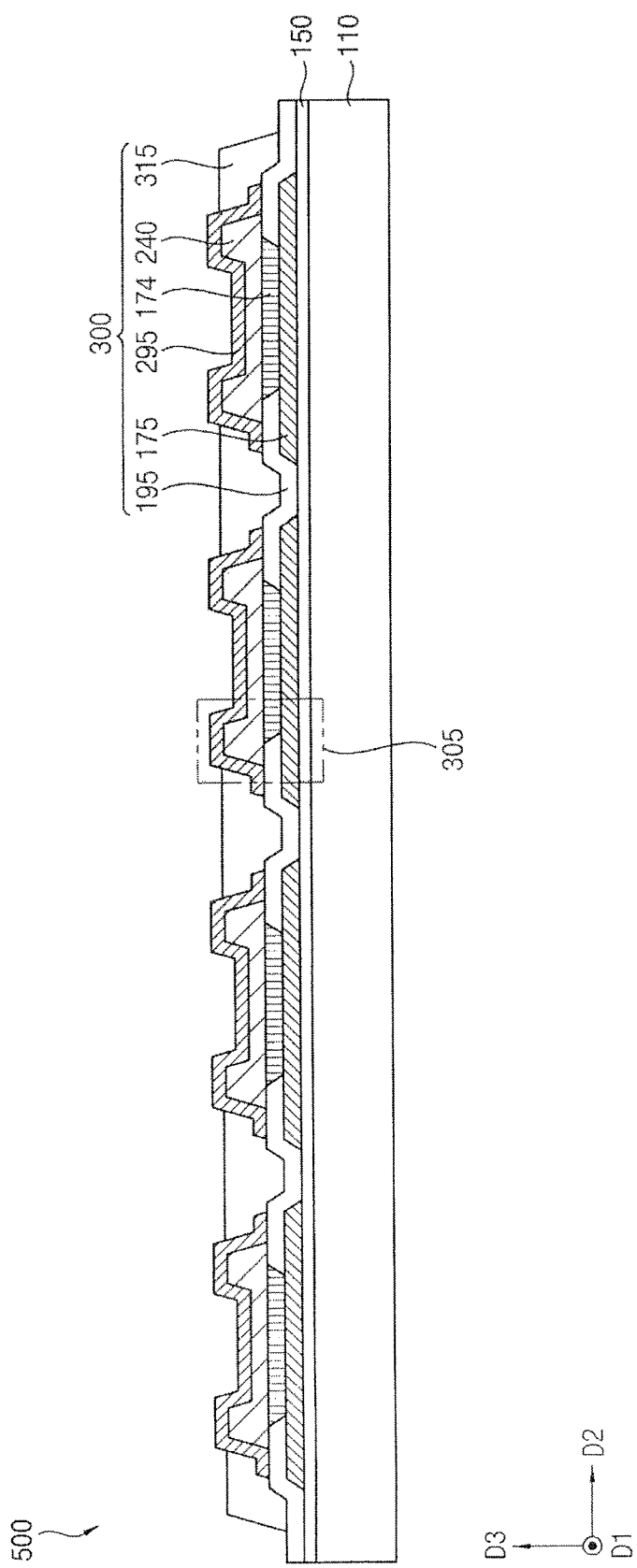
FIG. 18 illustrates a cross-sectional view of a pad electrode structure included in the OLED display device of FIG. 17.

FIG. 17 is a cross-sectional view illustrating an OLED display device in accordance with example embodiments, and FIG. 18 is a cross-sectional view for describing a pad electrode structure included in the OLED display device of FIG. 17. An OLED display device 500 illustrated in FIGS. 17 and 18 may have a configuration substantially the same as or similar to that of the OLED display device 100 described with reference to FIGS. 3 and 4, except a second gate electrode 172, a second insulating interlayer 192, and a fourth pad electrode 174. In FIGS. 17 and 18, detailed descriptions for elements that are substantially the same as or similar to elements described with reference to FIGS. 3 and 4 may not be repeated.

Referring to FIGS. 3, 4, 17 and 18, the OLED display device 500 may include the substrate 110, the semiconductor element 250, the pad electrode structure 300, the planarization layer 270, the display structure 200, the pixel defining layer 310, the encapsulation substrate 350, etc. Here, the semiconductor element 250 may include the active layer 130, the gate insulation layer 150, the first gate electrode 170, the first insulating interlayer 190, the second gate electrode 172, the second insulating interlayer 192, the source electrode 210, and the drain electrode 230. In addition, the display structure 200 may include the lower electrode 290, the light emitting layer 330, and the upper electrode 340. Further, the pad electrode structure 300 may include the first pad electrode 175, the first insulation layer 195, the second pad electrode 240, the third pad electrode 295, the fourth pad electrode 174, and the second insulation layer 315.

The first gate electrode 170 may be disposed on a portion of the gate insulation layer 150 under which the active layer 130 is located. The first gate electrode 170 may include, e.g., a metal, a metal alloy, metal nitride, conductive metal oxide, transparent conductive materials, etc. These may be used alone or in a suitable combination thereof.

The first insulating interlayer 190 may be disposed on the gate electrode 170. The first insulating interlayer 190 may cover the gate electrode 170 in the display region 10, and may extend along the first direction D1 on the substrate 110. The first insulating interlayer 190 may cover the first gate electrode 170 on the gate insulation layer 150, and may be disposed as a substantially uniform thickness along a profile of the first gate electrode 170. That is, the first insulating interlayer 190 may be entirely disposed in the display region 10 on the gate insulation layer 150. The first insulating interlayer 190 may include organic materials or inorganic materials. In example embodiments, the first insulating interlayer 190 may include inorganic materials such as silicon compound, metal oxide, etc.

The second gate electrode 172 may be disposed on a portion of the insulating interlayer 190 under which the first gate electrode 130 is located. The second gate electrode 172 may include, e.g., a metal, a metal alloy, metal nitride, conductive metal oxide, transparent conductive materials, etc. These may be used alone or in a suitable combination thereof.

The fourth pad electrode 174 may be disposed on a portion where the first pad electrode 175 is exposed by the first insulation layer 195. The fourth pad electrode 174 and the first insulation layer 195 may be located at the same level. Alternatively, the fourth pad electrode 174 may be disposed in a portion of an upper surface of the first insulation layer 195. In this case, a height of a step portion 305 may be relatively increased. In example embodiments, the fourth pad electrode 174 and the second gate electrode 172 may be simultaneously formed using the same material. For example, the fourth pad electrode 174 may include Au, Ag, Al, Pt, Ni, Ti, Pd, Mg. Ca, Li, Cr, Ta, W, Cu, Mo, Sc, Nd, Ir, an alloy of aluminum, $AlN_x$, an alloy of silver, $WN_x$, an alloy of copper, an alloy of molybdenum, $TiN_x$, $CrN_x$, $TaN_x$, SRO, $ZnO_x$, ITO, $SnO_x$, $InO_x$, $GaO_x$, IZO, etc. These may be used alone or in a suitable combination thereof. In some example embodiments, the fourth pad electrode 174 may have a multi-layered structure.

The second insulating interlayer 192 may be disposed on the second gate electrode 172. The second insulating interlayer 192 may cover the second gate electrode 172 in the display region 10, and may extend along a first direction D1 on the substrate 110. The second insulating interlayer 192 may cover the second gate electrode 172 on the first insulating interlayer 190, and may be disposed as a substantially uniform thickness along a profile of the second gate electrode 172. That is, the second insulating interlayer 192 may be entirely disposed in the display region 10 on the first insulating interlayer 190. The second insulating interlayer 192 may include organic materials or inorganic materials. In example embodiments, the second insulating interlayer 192 may include inorganic materials such as silicon compound, metal oxide, etc. Alternatively, the second insulating interlayer 192 may be disposed in the pad region 20, and may cover both lateral portions of the fourth pad electrode 174.

Accordingly, as the pad electrode structure 300 further includes the fourth pad electrode 174, a wiring resistance of the pad electrode structure 300 may be relatively reduced.

Figure 19:
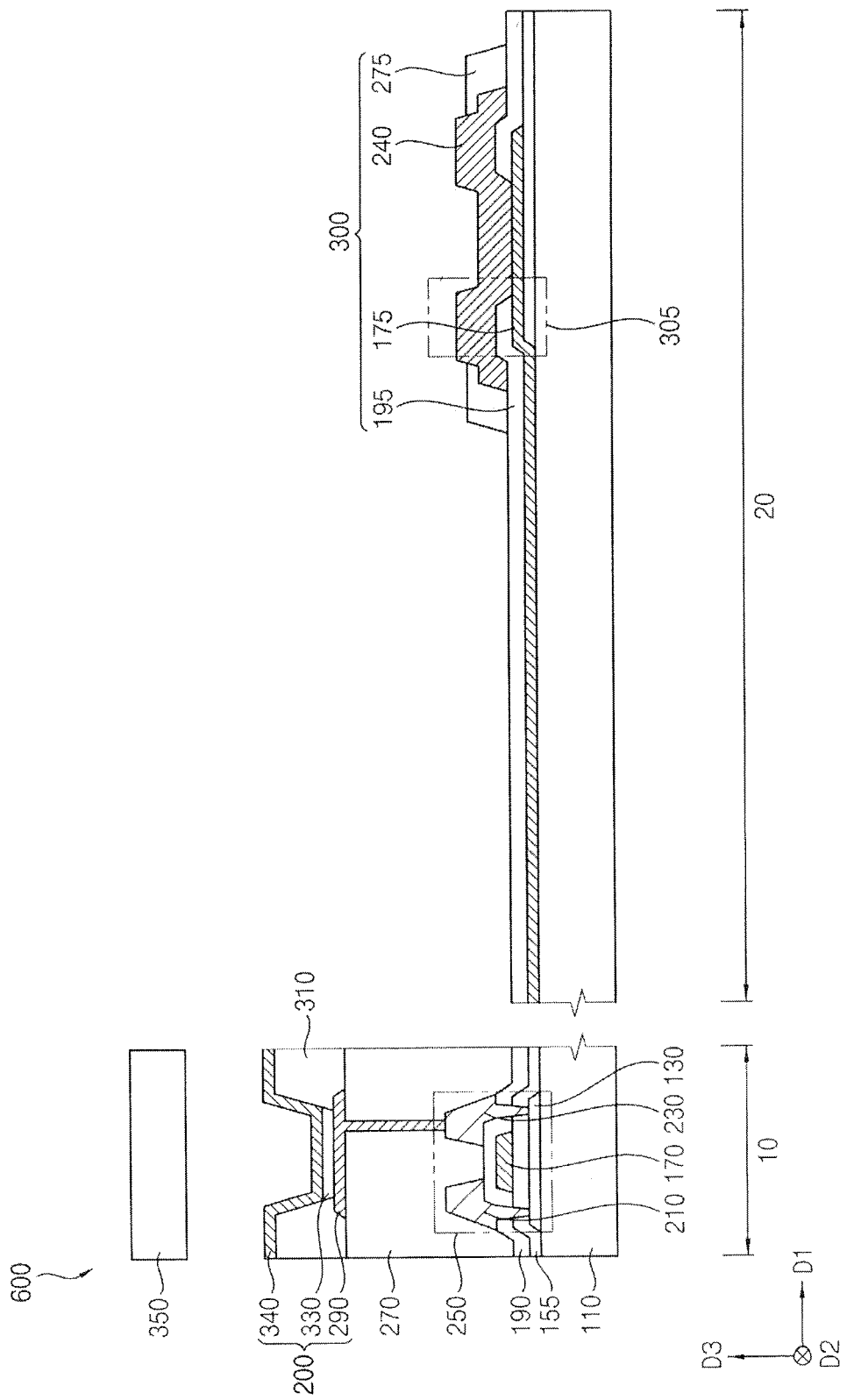
FIG. 19 illustrates a cross-sectional view of an OLED display device in accordance with example embodiments.
Figure 20:
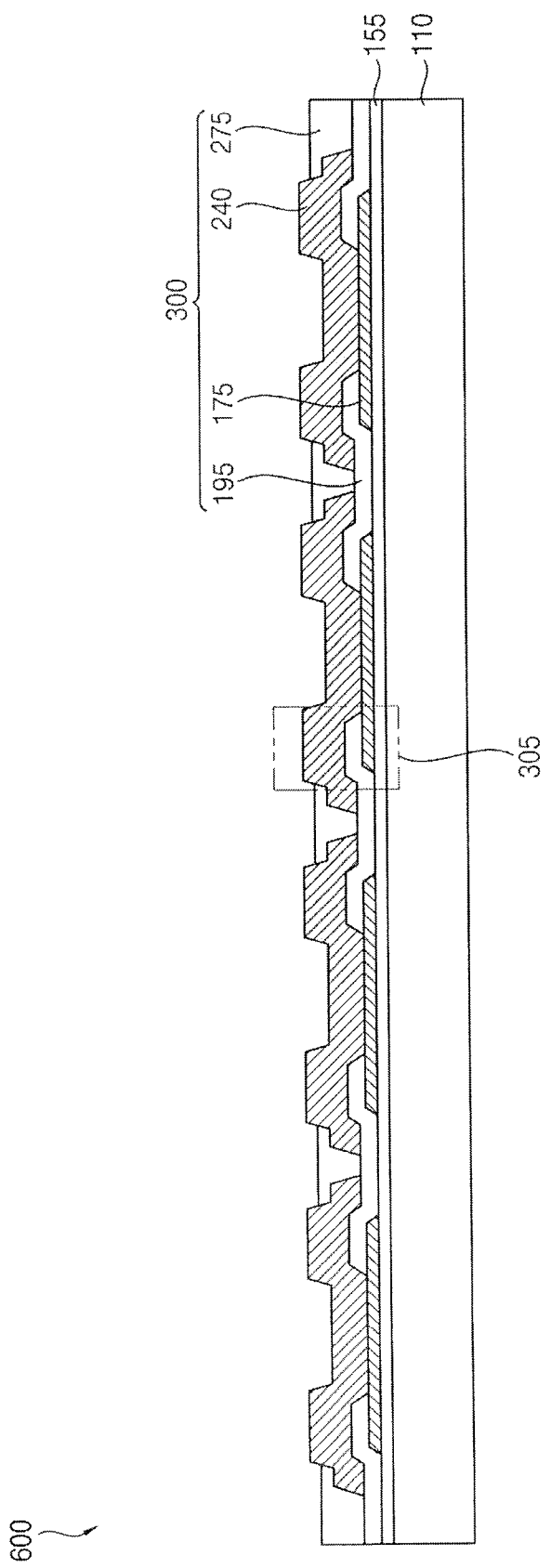
FIG. 20 illustrates a cross-sectional view of a pad electrode structure included in the OLED display device of FIG. 19.

FIG. 19 is a cross-sectional view illustrating an OLED display device in accordance with example embodiments, and FIG. 20 is a cross-sectional view for describing a pad electrode structure included in the OLED display device of FIG. 19. An OLED display device 600 illustrated in FIGS. 19 and 20 may have a configuration substantially the same as or similar to that of the OLED display device 100 described with reference to FIGS. 3 and 4. In FIGS. 19 and 20, detailed descriptions for elements that are substantially the same as or similar to elements described with reference to FIGS. 3 and 4 may not be repeated.

Referring to FIGS. 3, 4, 19, and 20, the OLED display device 600 may include the substrate 110, the semiconductor element 250, the pad electrode structure 300, the planarization layer 270, the display structure 200, the pixel defining layer 310, the encapsulation substrate 350, etc. Here, the semiconductor element 250 may include the active layer 130, a gate insulation layer 155, the gate electrode 170, the insulating interlayer 190, the source electrode 210, and the drain electrode 230. In addition, the display structure 200 may include the lower electrode 290, the light emitting layer 330, and the upper electrode 340. Further, the pad electrode structure 300 may include the first pad electrode 175, the first insulation layer 195, the second pad electrode 240, and the second insulation layer 275.

The gate insulation layer 155 may be disposed on the active layer 130. The gate insulation layer 155 may cover the active layer 130 in the display region 10, and may extend along the first direction D1 on the substrate 110. That is, the gate insulation layer 155 may be entirely disposed in the display region 10 on the substrate 110. The gate insulation layer 155 may cover the active layer 130 on the substrate 110, and may be disposed at a substantially uniform thickness along a profile of the active layer 130. Alternatively, the gate insulation layer 155 may sufficiently cover the active layer 130 on the substrate 110, and may have a substantially level surface without a step around the active layer 130. In example embodiments, the gate insulation layer 155 may be further disposed in a portion of the pad region 20 on the substrate 110. The gate insulation layer 155 may be disposed to overlap the second pad electrode 240 such that a step portion 305 is formed. Here, a width of a portion where the gate insulation layer 155 overlaps the second pad electrode 240 may be less than a width (e.g., a width extending along a first direction D1) of second pad electrode 240. The gate insulation layer 155 may include organic materials or inorganic materials. In example embodiments, the gate insulation layer 150 may include inorganic materials such as silicon compound, metal oxide, etc.

The second pad electrode 240 may be disposed in the pad region 20 on the first pad electrode 175 and the first insulation layer 195. In example embodiments, the second pad electrode 240 may have the step portion 305 in a portion where the gate insulation layer 155 that is located in the pad region 20, the first pad electrode 175 and the first insulation layer 195 are overlapped. That is, the second pad electrode 240 may be in direct contact with the first pad electrode 175, and may be in direct contact with a portion of an upper surface of the first insulation layer 195 that is located in the step portion 305. In addition, the second pad electrode 240 may be in direct contact with a portion of an upper surface of the first insulation layer 195 where the first pad electrode 175 located adjacent to the step portion step portion 305 and the first insulation layer 195 are overlapped. Further, the second pad electrode 240, the source electrode 210, and the drain electrode 230 may be simultaneously formed using the same material. For example, the second pad electrode 240 may include Au, Ag, Al, Pt, Ni, Ti, Pd, Mg, Ca, Li, Cr, Ta, W, Cu, Mo, Sc, Nd, Ir, an alloy of aluminum, $AlN_x$, an alloy of silver, $WN_x$, an alloy of copper, an alloy of molybdenum, $TiN_x$, $CrN_x$, $TaN_x$, SRO, $ZnO_x$, ITO, SnOx, $InO_x$, $GaO_x$, IZO, etc. These may be used alone or in a suitable combination thereof. In example embodiments, the second pad electrode 240 may have a multi-layered structure. For example, the second pad electrode 240 may have a stack electrode structure including Ti/Al/Ti (refer to FIG. 5).

The second insulation layer 275 may cover both lateral portions of the second pad electrode 240 in the pad region 20. For example, the second insulation layer 275 may be disposed on a portion of the second pad electrode 240 and the first insulation layer 195 such that a distal end portion of the second pad electrode 240 is not exposed. In example embodiments, the second insulation layer 275 and the planarization layer 270 may be simultaneously formed using the same material. For example, the second insulation layer 275 may include a polyimide-based resin, a photoresist, an acryl-based resin, a polyamide-based resin, a siloxane-based resin, etc.

In example embodiments, a first height from the substrate 110 into an upper surface of the second insulation layer 275 (e.g., a height extending along a third direction D3 that is vertical to the first and second directions D1 and D2) may be less than a second height from the substrate 110 into an upper surface of the second pad electrode 240 that is disposed on the step portion 305. For example, the pad electrode structure 300 and an ACF may be bonded by using the ACF such that an external device 101 is electrically connected to the pad electrode structure 300. Here, the first height may be less than the second height such that a conductive ball included in the ACF is in readily contact with an upper surface of the second pad electrode 240. Thus, the external device 101 and the pad electrode structure 300 may be electrically connected. On the contrary, when the first height is greater than the second height, the conductive ball may not be in contact with the second pad electrode 240 by the second insulation layer 275, and the external device 101 may not be electrically connected to the pad electrode structure 300.

As described above, the planarization layer 270 and the second insulation layer 275 may be simultaneously formed. Meanwhile, a thickness (e.g., a thickness extending along the third direction D3) of the planarization layer 270 may be different from a thickness of the second insulation layer 275. For example, the second insulation layer 275 may be formed using a half tone mask such that the second insulation layer 275 has the first height. Thus, a thickness of the second insulation layer 275 may be relatively less than a thickness of the planarization layer 270.

Accordingly, the pad electrode structure 300 including the first pad electrode 175, the first insulation layer 195, the second pad electrode 240, and the second insulation layer 275 may be disposed.

The OLED display device 600 in accordance with example embodiments includes the pad electrode structure 300 having the first pad electrode 175, the first insulation layer 195, the second pad electrode 240, and the second insulation layer 275 (e.g., compared to an OLED display device 100, the third pad electrode 295 is not disposed). Accordingly, a manufacturing cost of the OLED display device 600 may be relatively decreased.

Embodiments may be applied to various display devices including an organic light emitting diode (OLED) display device. For example, embodiments may be applied to vehicle-display device, a ship-display device, an aircraft-display device, portable communication devices, display devices for display or for information transfer, a medical-display device, etc.

By way of summation and review, in a manufacturing process for forming pad electrodes for an OLED display device, the pad electrodes may be damaged by an etchant that is used for forming an anode electrode included in the OLED display device. Therefore, example embodiments provide an OLED display device including a pad electrode structure, so the OLED display device protects the second pad electrode from an etchant used in a process for forming the lower electrode.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode (OLED) display device, comprising:
   a substrate including a display region and a pad region;
   a display structure in the display region on the substrate; and
   a pad electrode structure in the pad region on the substrate, the pad electrode structure including:
      a first pad electrode on the substrate,
      a first insulation layer covering opposite lateral portions of the first pad electrode and exposing a portion of an upper surface of the first pad electrode,
      a second pad electrode on the first pad electrode and on the first insulation layer, the second pad electrode having a step portion where the first pad electrode and the first insulation layer are overlapped,
      a third pad electrode on the second pad electrode and on the first insulation layer, the third electrode covering the second pad electrode, and
      a solid second insulation layer covering opposite lateral portions of the third pad electrode.

2. The OLED display device as claimed in claim 1, wherein the second insulation layer is on a portion of the third pad electrode and on the first insulation layer such that a distal end portion of the third pad electrode is not exposed.

3. The OLED display device as claimed in claim 1, wherein a height from the substrate to an upper surface of the second insulation layer is less than a height from the substrate to an upper surface of the third pad electrode that is located in the step portion.

4. The OLED display device as claimed in claim 1, wherein the display structure includes:
   a lower electrode in the display region on the substrate;
   a light emitting layer on the lower electrode; and
   an upper electrode on the light emitting layer.

5. The OLED display device as claimed in claim 4, wherein the lower electrode and the third pad electrode include a same material.

6. The OLED display device as claimed in claim 4, further comprising:
   a planarization layer between the substrate and the display structure; and
   a pixel defining layer on the planarization layer, the pixel defining layer covering opposite lateral portions of the lower electrode.

7. The OLED display device as claimed in claim 6, wherein the pixel defining layer and the second insulation layer include a same material.

8. The OLED display device as claimed in claim 1, wherein a distal end portion of the third pad electrode is in contact with an upper surface of the first insulation layer such that the second pad electrode is not exposed.

9. The OLED display device as claimed in claim 1, wherein each of the second pad electrode and the third pad electrode has a stack electrode structure including a plurality of electrode layers.

10. The OLED display device as claimed in claim 9, wherein the second pad electrode has the stack electrode structure including titanium/aluminum/titanium, and the third pad electrode has the stack electrode structure including indium-tin-oxide/silver/indium-tin-oxide.

11. The OLED display device as claimed in claim 9, further comprising a semiconductor element between the substrate and the display structure,
   wherein the semiconductor element includes:
      an active layer in the display region on the substrate,
      a gate insulation layer covering the active layer in the display region on the substrate and extending into the pad region,
      a gate electrode on the gate insulation layer,
      an insulating interlayer covering the gate electrode in the display region on the gate insulation layer and extending into the pad region, and
      source and drain electrodes on the insulating interlayer.

12. The OLED display device as claimed in claim 11, wherein the gate electrode and the first pad electrode include a same material, and the source and drain electrodes and the second pad electrode include a same material.

13. The OLED display device as claimed in claim 11, wherein the gate insulation layer is defined as the first insulation layer in the pad region, and the insulating interlayer is defined as the second insulation layer in the pad region.

14. The OLED display device as claimed in claim 1, further comprising an encapsulation substrate in the display region on the substrate, the encapsulation substrate being opposite to the substrate, and the substrate and the encapsulation substrate having rigid materials.

15. The OLED display device as claimed in claim 1, wherein the pad electrode structure further includes a fourth pad electrode between the first pad electrode and the second pad electrode.

* * * * *